United States Patent
Holmes et al.

(10) Patent No.: US 11,063,162 B2
(45) Date of Patent: Jul. 13, 2021

(54) CURRENT GENERATION FROM RADIATION WITH DIAMOND DIODE-BASED DEVICES FOR DETECTION OR POWER GENERATION

(71) Applicant: ARIZONA BOARD OF REGENTS ON BEHALF OF ARIZONA STATE UNIVERSITY, Scottsdale, AZ (US)

(72) Inventors: Jason M Holmes, Mesa, AZ (US); Franz A Koeck, Tempe, AZ (US); Manpuneet Benipal, Tempe, AZ (US); Ricardo O Alarcon, Chandler, AZ (US); Stephen Goodnick, Fort McDowell, AZ (US); Anna Zaniewski, Tempe, AZ (US); Robert Nemanich, Scottsdale, AZ (US)

(73) Assignee: ARIZONA BOARD OF REGENTS ON BEHALF OF ARIZONA STATE UNIVERSITY, Scottsdale, AZ (US)

( * ) Notice: Subject to any disclaimer, the term of this patent is extended or adjusted under 35 U.S.C. 154(b) by 0 days.

(21) Appl. No.: 16/601,038

(22) Filed: Oct. 14, 2019

(65) Prior Publication Data
US 2020/0119207 A1 Apr. 16, 2020

Related U.S. Application Data

(60) Provisional application No. 62/745,414, filed on Oct. 14, 2018.

(51) Int. Cl.
*H01L 31/0288* (2006.01)
*H01L 31/115* (2006.01)

(52) U.S. Cl.
CPC ........ *H01L 31/0288* (2013.01); *H01L 31/115* (2013.01)

(58) Field of Classification Search
CPC . H01L 31/0288; H01L 31/115; H01L 31/028; H01L 31/117
See application file for complete search history.

(56) References Cited

U.S. PATENT DOCUMENTS

| 3,227,876 A | * | 1/1966 | Bernd | ........................ G01T 3/08 250/371 |
| 3,805,078 A | | 4/1974 | Kozlov | |

(Continued)

OTHER PUBLICATIONS

Author Unknown, "Lecture 9: Metal-semiconductor junctions," MM5017: Electronic materials, devices, and fabrication, NPTEL, accessed Aug. 2018 from https://nptel.ac.in/content/storage2/courses/113106062/Lec9.pdf, 16 pages.

(Continued)

*Primary Examiner* — Sitaramarao S Yechuri
(74) *Attorney, Agent, or Firm* — Withrow & Terranova, P.L.L.C.

(57) ABSTRACT

Diamond diode-based devices are configured to convert radiation energy into electrical current, useable for sensing (i.e., detection) or delivery to a load (i.e., energy harvesting). A diode-based detector includes an intrinsic diamond layer arranged between p-type diamond and n-type diamond layers, with the detector further including at least one of (i) a boron containing layer arranged proximate to the n-type and/or the intrinsic diamond layers, or (ii) an intrinsic diamond layer thickness in a range of 10 nm to 300 microns. A diode-based detector may be operated in a non-forward biased state, with a circuit used to transmit a current pulse in a forward bias direction to reset a detection state of the detector. An energy harvesting device may include at least one p-i-n stack (including an intrinsic diamond layer between p-type diamond and n-type diamond layers), with a radioisotope source arranged proximate to the at least one p-i-n stack.

22 Claims, 13 Drawing Sheets

(56) References Cited

U.S. PATENT DOCUMENTS

| | | | |
|---|---|---|---|
| 4,419,578 | A | 12/1983 | Kress |
| 5,216,249 | A | 6/1993 | Jones et al. |
| 5,406,081 | A * | 4/1995 | Inushima ............ H01L 31/1804 250/338.4 |
| 5,859,484 | A | 1/1999 | Mannik et al. |
| 6,506,148 | B2 | 1/2003 | Loos |
| 7,516,741 | B2 | 4/2009 | Glusker et al. |
| 8,158,455 | B2 | 4/2012 | Linares |
| 9,922,791 | B2 | 3/2018 | Koeck et al. |
| 10,121,657 | B2 | 11/2018 | Koeck et al. |
| 10,418,475 | B2 | 9/2019 | Chowdhury et al. |
| 10,704,160 | B2 | 7/2020 | Koeck et al. |
| 2008/0203397 | A1* | 8/2008 | Amaratunga ....... H01L 31/0288 257/77 |
| 2008/0217623 | A1* | 9/2008 | Hara ............... H01L 31/035272 257/66 |
| 2013/0180576 | A1* | 7/2013 | Sung ............... H01L 31/022466 136/255 |
| 2014/0264436 | A1* | 9/2014 | Whiting ................ H01L 31/109 257/183 |
| 2016/0043260 | A1 | 2/2016 | Nemanich et al. |
| 2016/0356901 | A1* | 12/2016 | Shao ..................... H01L 31/117 |
| 2017/0330746 | A1 | 11/2017 | Koeck et al. |
| 2018/0204702 | A1 | 7/2018 | Koeck et al. |

OTHER PUBLICATIONS

Author Unknown, "Schottky diode," Physics and Radio-Electronics, accessed Sep. 2018 from https://www.physics-and-radio-electronics.com/electronic-devices-and-circuits/semiconductor-diodes/schottkydiode.html, 19 pages.

Author Unknown, "The Metal-Semiconductor Junction. Schottky Diode. OHMIC Contacts," Vilniaus Universitetas, Semiconductor Physics Department, Lithuania, accessed Oct. 2018 from https://in.ncu.edu.tw/ncume_ee/SchottkyDiode.htm, 20 pages.

Author Unknown, "Vision and Voyages for Planetary Science in the Decade 2013-2022," 2011, National Academies Press, 399 pages.

Bentele, B. et al., "Rate dependence, polarization, and light sensitivity of neutron-irradiated scCVD diamond sensors," Nuclear Instruments and Methods in Physics Research A, vol. 838, 2016, Elsevier B.V., pp. 74-81.

Bergonzo, P. et al., "Improving diamond detectors: A device case," Diamond and Related Materials, vol. 16, 2007, Elsevier B.V., pp. 1038-1043.

Bohr, N., "The Penetration of Atomic Particles Through Matters," The Royal Danish Society of Sciences, Mathematical-Physical Communication 18 (8), 1948, 144 pages.

Brezeanu, M., "Diamond Schottky Barrier Diodes," Dissertation, Churchill College, Department of Engineering, University of Cambridge, Aug. 2007, 164 pages.

Dutta, et al., "High Voltage Diodes in Diamond Using (100)- and (111)-Substrates," IEEE Electron Device Letters, vol. 38, Issue 5, May 2017, pp. 600-603.

Eon, D. et al., "Diamond Schottky diodes for high power electronics," Highlights 2014, Institut NEEL, 1 page.

Ershaidat, N., "Chapter 4: General Properties of Radiation Detectors—Supplements," Phys. 649: Nuclear Techniques, Physics Department, Yarmouk Univeristy, accessed 2018 from Chapter 4: General Properties of Radiation Detectors—Supplements, 20 pages.

Grilj, V. et al., "Irradiation of thin diamond detectors and radiation hardness tests using MeV protons," Nuclear Instruments and Methods in Physics Research B, No. 306, 2013, Elsevier B.V., pp. 191-194.

Grotjohn, T., "Diamond Diode Devices," ARPA-E, Oct. 19, 2017, https://arpa-e.energy.gov/sites/default/files/1050_Grotjohn_SWITCHES%20Meeting_3-2017_MSU.pdf, 13 pages.

Buthoff, M. et al., Radiation damage in the diamond based beam condition monitors of the CMS experiment at the Large Hadron Collider (LHC) at CERN, Nuclear Instruments and Methods in Physics Research A, No. 730, 2013, Elsevier B.V., pp. 168-173.

Hathwar, et al., "Temperature Dependent Simulation of Diamond Depleted Schottky Diodes," Journal of Applied Physics, vol. 119, 2016, AIP Publishing, 7 pages.

Hecht, K., "Zum Mechanismus des lichtelektrischen Primarstromesin isolierenden Kristallen," Zeitschrift für Physik., vol. 77, May 1932, pp. 235-245.

Holmes, J. et al., "A 4.5 m PIN diamond diode for detecting slow neutrons," Nuclear Inst. and Methods in Physics Research, A, No. 903, 2018, Elsevier B.V., pp. 297-301.

Ibragimov, R.F. et al., "Research of work stability of diamond detectors used in SCR DDIR," Journal of Physics: Conference Series 675, International Conference on Particle Physics and Astrophysics (ICPPA-2015), 2016, IOP Publishing, 5 pages.

Kada, W. et al., "Continuous observation of polarization effects in thin SC-CVD diamond detector designed for heavy ion microbeam measurement," Nuclear Instruments and Methods in Physics Research B, No. 331, 2014, Elsevier B.V., 4 pages.

Khumpuang, et al., "Analyses on Cleanroom-Free Performance and Transistor Manufacturing Cycle Time of Minimal Fab," IEEE Transactions on Semiconductor Manufacturing, vol. 28, Issue 4, Nov. 2015, 7 pages.

Liu, L.-Y. et al., "The Fabrication and Characterization of Ni/4H-SiC Schottky Diode Radiation Detectors with a Sensitive Area of up to 4 cm2," Sensors, vol. 17, No. 2334, MDPI, 9 pages.

Manfredotti, C. et al., "Effects of light on the 'primed' state of CVD diamond nuclear detectors," Diamond and Related Materials, vol. 11, Elsevier Science B.V., pp. 446-450.

Marinelli, M. et al., "A novel synthetic single crystal diamond device for in vivo dosimetry," Medical Physics, vol. 42, No. 8, Aug. 2015, American Association of Physicists in Medicine, 9 pages.

Mercer, C. et al., "HOTTech Program Overview," Venus Exploration Analysis Group Meeting, Laurel, MD, Nov. 6, 2018, Planetary Exploration Science Technology Office, NASA, https://www.lpi.usra.edu/vexag/meetings/archive/vexag-16/presentations/Mercer.pdf, 33 pages.

Nemanich, R. et al., "High Temperature Diamond Electronics for Actuators and Sensors," 17th VEXAG Meeting 2019, LPI Contrib. No. 2193, 1 page.

Oyama, K., et al., "High performance of diamond p+-i-n+ junction diode fabricated using heavily doped p+ and n+ layers," Applied Physics Letters, vol. 94, Issue 15, 2009, AIP Publishing, 2 pages.

Osipenko, M. et al., "Neutron spectrometer for fast nuclear reactors," arXiv: 1505.06654v1, May 25, 2015, 8 pages.

Pomorski, M. et al., "Charge transport properties of single crystal CVD-diamond particle detectors," Diamond and Related Materials, vol. 16, 2007, Elsevier B.V., pp. 1066-1069.

Rebai, M. et al., "Time-stability of a Single-crystal Diamond Detector for fast neutron beam diagnostic under alpha and neutron irradiation," Diamond & Related Materials, vol. 61, 2016, Elsevier B.V., 6 pages.

Saremi, et al., "Analysis of the reverse I-V Characteristics of Diamond-based PIN Diodes," Applied Physics Letters, vol. 111, Issue 4, 2017, AIP Publishing, 5 pages.

Sharaf, A. et al., "New nanostructured Schottky diode gamma-ray radiation sensor," Procedia Engineering, vol. 87, 2014, Elsevier Ltd., pp. 1184-1189.

Shikata, et al., "Development of diamond-based power devices," Synthesiology, vol. 6, No. 3, Dec. 2013, pp. 152-161.

Tanimura, Y. et al., "High-temperature operation of a radiation detector made of a type IIa diamond single crystal synthesized by a HP/HT method," Nuclear Instruments and Methods in Physics Research A, vol. 443, 2000, Elsevier Science B.V., pp. 325-330.

Tatsumi, N. et al., "Development of Diamond Schottky Barrier Diode," SEI Technical Review, No. 68, Apr. 2009, pp. 54-61.

Traore, A., "Diamond Semiconductor Devices," ISPS 2016, 34 pages.

Traore, A., "High power diamond Schottky diode," Micro and nanotechnologies/Microelectronics, Université de Grenoble, 2014, 217 pages.

Verona, C. et al., "Spectroscopic properties and radiation damage investigation of a diamond based Schottky diode for ion-beam therapy microdosimetry," Journal of Applied Physics, vol. 118, 2015, AIP Publishing LLC, 8 pages.

(56) References Cited

OTHER PUBLICATIONS

Wade, T. et al., "Effect of surface roughness and H-Termination chemistry on diamond's semiconducting surface conductance," Diamond and Related Materials, vol. 76, Jun. 2017, 16 pages.
Yang, Yu, et al., "Al2O3 dielectric layers on H-terminated diamond: Controlling surface conductivity," Journal of Applied Physics, vol. 122, Issue 15, Oct. 2017, AIP Publishing, 7 pages.

* cited by examiner

CURRENT GENERATION FROM RADIATION WITH DIAMOND DIODE-BASED DEVICES FOR DETECTION OR POWER GENERATION

CROSS-REFERENCE TO RELATED APPLICATION(S)

This application claims benefit of U.S. Provisional Patent Application No. 62/745,414 filed on Oct. 14, 2019, wherein the entire contents of the foregoing application are hereby incorporated by reference herein.

GOVERNMENT RIGHTS IN INVENTION

This invention was made with government support under DE-AR0000453 awarded by the Department of Energy. The government has certain rights in the invention.

TECHNICAL FIELD

The present disclosure relates generally to diamond diode-based devices, and more specifically to diamond diode-based detector devices and diamond diode-based energy harvesting devices capable of converting radiation or radioactive decay products to electrical signals or current.

BACKGROUND

Diamond electronics can provide significant advances in high power and high frequency electronics, radiation detectors for medical and military applications, and ultraviolet (UV) optoelectronics due to exceptional material properties like large bandgap energy (5.5 eV), the breakdown electric field (10 MV/cm), the carrier mobilities (~2200 and ~1600 $cm^2/Vs$ for electrons and holes resp.), the thermal conductivity (10-20 W/cmK), the low dielectric constant (5.5), and the excellent resistance to radiation. Diamond may be synthesized by a high pressure high temperature (HPHT) process from graphite and by chemical vapor deposition (CVD) from gaseous reactants. For device fabrication, natural, mined, HPHT-grown, or CVD-grown diamonds can be used as substrates for CVD growth of further epitaxial layers. P-type diamond can be obtained through boron doping, and n-type diamond can be obtained by doping with phosphorus or nitrogen. Methods and apparatuses for fabricating n-type diamond material and diamond electronic device are disclosed in U.S. Patent Application Publication No. 2017/0330746 A1 to Koeck et al., with the contents of such publication hereby being incorporated by reference herein.

Detection of radioactive decay products (such as neutrons, protons, alpha particles, beta particles, gamma rays, X-rays, and the like) has wide applicability in various contexts including monitoring of nuclear reactors, radiation therapy, and nuclear medicine. Solid state detectors would be attractive replacements for conventional gas filled counters, but silicon-based solid state detectors have limited applicability due to their susceptibility to crystalline damage upon exposure to high radiation environments. Moreover, conventional silicon dosimeters do not provide real-time feedback, suggesting an individual may not know whether he or she was exposed to significant radiation until additional tests are run on the dosimeter—by which time, any biological effects of exposure to radiation have already taken place.

Diamond-based detectors have long been perceived as a potentially attractive alternative to silicon-based detectors. Incident radiation on a diamond-based electronic device will cause excitation of electron-hole pairs, and this charge may be separated by an electric field and collected. High electron and hole mobilities in diamond provide higher efficiency for charge collection than any other semiconductor material. Diamond's high displacement energy and low Z account for its extreme radiation hardness. Diamond's large bandgap of 5.5 eV suppresses noise, enabling sensitivity to a large range of particle fluence. Diamond can also operate at extreme temperatures, >800° C., and can withstand high-energy radiation. To date, however, diamond-based detectors have not found widespread adoption in nuclear reactor monitoring or other commercial contexts.

In general, solid state radiation detectors may be used in either current mode or pulse mode. Current mode is used to measure the net interaction current (energy deposition). In pulse mode, each individual radiation interaction is recorded in the form of a current pulse. One challenge inherent to pulse mode detectors is the ability to measure fast radiation emission rate. Pulse counting mode is not feasible for use with materials having low response time, since detector response time must be faster than the fluence rate when pulse counting mode is used. The fast charge separation and collection efficiency of diamond semiconductors are beneficial for this fast event rate detection. The intensity of peaks generated in pulse mode implies the energy of emitted radiation. This feature is important for applications in radiation therapy and nuclear medicine to determine the exact dose of radiation/medicine, and to monitor radiation in industrial and clinical environments.

Among energetic particles, neutrons present a challenge to detect efficiently, since neutrons do not carry charge or interact with electrons directly. The detection of neutrons in solid-state and gas-based detectors is therefore based on indirect detection methods, and many detector designs are not selective against gamma rays. Detection of slow neutrons is of particular significance in present day commercial nuclear reactors as well as in basic research at spallation sources and research reactors. The measurement of neutron flux distribution at many points in any reactor is the first step in calculating and setting the most economical operating power, and it is considered critical input for reactor safety and reactor control systems Another limitation of diamond detectors relates the polarization effect in diamond semiconductors. During irradiation, electrons and holes are created and begin traversing the diamond, with some being trapped by diamond defects—resulting in a buildup of negative net charge near the (+) electrode and positive net charge near the (−) electrode, leading to a reduction in field strength across the diamond. Polarization buildup is a relatively slow process that depends on the detector, the diamond quality, and the electric field across the diamond, usually occurring over many seconds or minutes until finally stabilizing once the rate of trapping matches the rate of detrapping. The polarization effect also becomes more pronounced as diamond detectors are damaged by radiation. Studies have identified a variety of techniques for minimizing polarization, including heating the detector, alternating the bias polarity, setting the bias off and waiting, and illuminating the detector with light. These methods for reducing the effect of polarization can be effective depending on the application, but can be difficult to implement—requiring careful observation of the signal returning to pre-polarized levels, a knowledge of pre-polarized signal levels, and a time period of minutes or tens of minutes.

Beyond the context of radiation detection, diamond's physical properties make conversion of radiation to electric current attractive for energy harvesting applications. The operating principle of an energy harvesting device responsive to radioactive decay products is similar to that of a radiation detector, except that the generated current is delivered to a load. A diamond-based solid state energy harvesting device may be attractive in any context where a compact, lightweight power generation device having a long lifetime (e.g., decades) is needed. Potential commercial applications include powering items such as remote sensors, medical devices, smart infrastructure devices, and environmental monitoring devices. However, limited efficiency has inhibited widespread implementation of diamond-based energy harvesting devices.

Other radiation detectors are known. As one example, U.S. Pat. No. 3,227,876 describes a silicon-based radiation detector. However, small band gap materials (such as silicon) have significant thermal noise and thus require cooling, which adds size, complexity, expense, and machinery to a detection system. Additionally, cooling is not feasible in many radiation environments. Furthermore, silicon-based solid state detectors also are more susceptible to damage, lowering their lifetime and reliability.

As another example, U.S. Pat. No. 5,216,249 describes polycrystalline diamond radiation detectors. However, polycrystalline diamond has poor charge collection efficiency due to the presence of grain boundaries.

U.S. Pat. No. 4,419,578 describes a neutron detector based on hydrocarbon semiconductors. However, hydrocarbon materials have inferior mobility and charge collection efficiency compared to single crystal diamond. A lower response time of the material reduces the ability of such materials to track particles in pulse counting mode, in which the detector response time must be faster than fluence rate.

U.S. Pat. No. 3,805,078 describes neutron detectors based upon diamond plates, without doped layers. This design requires application of a relatively high external voltage than, and results in a larger intrinsic layer thickness. This reduces the selectivity of the detector to neutrons, since a thick intrinsic layer will also detect gamma rays.

Radioisotope powered solid state battery-type devices are also known. For example, U.S. Pat. No. 5,859,484 describes a radioisotope powered solid state battery based on semiconductor p-n junctions, quantum wells, and heterostructures. Devices based on p-n junctions, heterostructures, and quantum wells are susceptible to interface diffusion at elevated temperatures, may not be suitable for low voltage operation, and may be vulnerable to radiation damage.

Need exists in the art for diode-based detection devices and energy harvesting devices that address limitations associated with conventional devices.

SUMMARY

The present disclosure includes diamond diode-based devices configured to convert radiation energy into electrical current, which can be used for sensing (i.e., detection) or delivered to a load (i.e., energy harvesting). Embodiments disclosed herein provide new advances that increase the efficiency of charge collection, creating more sensitive radiation detectors and/or more efficient power sources.

In one aspect, the disclosure relates to diode-based detector device comprising: a p-type diamond layer; a n-type diamond layer; and an intrinsic diamond layer arranged between the p-type diamond layer and the n-type diamond layer; wherein the diode-based detector device further comprises at least one of the following features (i) or (ii): (i) a boron-containing layer is arranged proximate to at least one of the n-type diamond layer or the intrinsic diamond layer, wherein the boron-containing layer comprises one or more of boron nitride, boron carbide, boron oxide, boron, a conducting metal boride, or another boron compound; or (ii) the intrinsic diamond layer comprises a thickness in a range of from 10 nm to 300 microns. In certain embodiments, the device comprises feature (i). In certain embodiments, the device comprises feature (ii). In further embodiments, the device comprises features (i) and (ii).

In certain embodiments, the device further comprises a first metal-containing contact adjacent to the n-type diamond layer, and a second metal-containing contact adjacent to the p-type diamond layer. In certain embodiments, the first metal-containing contact comprises an ohmic contact, and the second metal-containing contact comprises an ohmic contact; in other embodiments, the first metal-containing contact comprises a Schottky contact, and the second metal-containing contact comprises an ohmic contact.

In certain embodiments, the device further comprises a first metal-containing contact adjacent to the n-type diamond layer, and a second metal-containing contact adjacent to the p-type diamond layer, wherein the first metal-containing contact is arranged between the n-type diamond layer and the boron-containing layer.

In certain embodiments, the boron-containing layer comprises a conducting boron-containing layer, and the n-type diamond layer is arranged between the conducting boron-containing layer and the intrinsic diamond layer. In certain embodiments, the conducting boron-containing layer serves as a first contact, and the diode-based detector device further comprises a metal-containing contact adjacent to the p-type diamond layer.

In certain embodiments, the intrinsic diamond layer includes a first intrinsic diamond sublayer and a second intrinsic diamond sublayer; and the boron-containing layer is arranged between the first intrinsic diamond sublayer and the second intrinsic diamond sublayer.

In certain embodiments, the p-type diamond layer comprises single crystal diamond material doped with boron at a first concentration; and the boron-containing layer (which differs from the foregoing p-type diamond layer) comprises a p-type single crystal diamond material doped with boron at a second concentration, wherein the second concentration is less than the first concentration.

In certain embodiments, each of the p-type diamond layer, the n-type diamond layer, the first intrinsic diamond sublayer, and the second intrinsic diamond sublayer comprises single crystal material; and the boron-containing layer comprises one or more of boron nitride, boron carbide, boron oxide, boron, or another boron compound.

In certain embodiments, boron atoms present in the boron-containing layer comprise at least 21% $^{10}$B.

In certain embodiments, each of the p-type diamond layer, the n-type diamond layer, and the intrinsic diamond layer comprises single crystal material (optionally having a crystallographic orientation of (111), (100), or another orientation).

In certain embodiments, each of the p-type diamond layer, the n-type diamond layer, and the intrinsic diamond layer comprises polycrystalline material.

In certain embodiments, the intrinsic diamond layer comprises a thickness in a range of from 10 nanometers to 5 microns, or in a range of from 6 microns to 300 microns.

In certain embodiments, the p-type diamond layer is doped with boron, and the n-type diamond layer is doped with phosphorus or nitrogen.

In certain embodiments, the device embodies a vertical diode detector device having a top side, a bottom side opposing the top side, a first contact accessible from the top side, and a second contact accessible from the bottom side. In certain embodiments, the device embodies a quasi-vertical diode detector device having a top side, a bottom side opposing the top side, and first and second contacts accessible from the top side.

In certain embodiments, the device comprises a circuit configured to transmit a current pulse in a forward bias direction of the diode-based detector device to reset a detection state of the diode-based detector device, wherein during detector operation, the diode-based detector device is configured to be operated in a non-forward-biased state.

In certain embodiments, the device is configured to operate at an applied voltage of greater than or equal to 0 V. In certain embodiments, the device is configured for detection of one or more of neutrons, protons, alpha particles, or beta particles. In certain embodiments, the device is configured for detection of one or more of X-rays, ultraviolet rays, gamma rays, or photons.

In certain embodiments, a detector array comprises (at least) a first and a second diamond diode-based detector device as disclosed herein. Any suitable or desirable number of diamond diode-based detectors may be provided. In certain embodiments, a diamond diode-based detector array may include multiple diamond detectors connected by one or more diamond layers, such as a common intrinsic diamond layer that is sandwiched between p-type and n-type diamond layers, or a substrate (optionally embodying intrinsic diamond) not arranged between p-type and n-type diamond layers.

In another aspect, the present disclosure relates to a diode-based detector device comprising: a p-type diamond layer; an intermediate diamond layer arranged proximate to the p-type diamond layer and comprising (a) intrinsic diamond material, or (b) p-type diamond material having a second p-type dopant concentration that is less than the first p-type dopant concentration; and a circuit configured to transmit a current pulse in a forward bias direction of the diode-based detector device to reset a detection state of the diode-based detector device; wherein during detector operation, the diode-based detector device is configured to be operated in a non-forward-biased state.

In certain embodiments, the device further comprises a Schottky contact adjacent to the intermediate diamond layer, and an ohmic contact adjacent to the p-type diamond layer, wherein the intermediate diamond layer is arranged between the p-type diamond layer and the Schottky contact.

In certain embodiments, the device further comprises an n-type diamond layer, wherein the intermediate diamond layer is arranged between the p-type diamond layer and the n-type diamond layer.

In certain embodiments, the device further comprises a first metal-containing contact adjacent to the n-type diamond layer, and a second metal-containing contact adjacent to the p-type diamond layer. In certain embodiments, each of the first metal containing contact and the second metal-containing contact comprises an ohmic contact.

In certain embodiments, the device further comprises a boron-containing layer proximate to at least one of the n-type diamond layer or the intermediate diamond layer, wherein the boron-containing layer comprises one or more of boron nitride, boron carbide, boron oxide, boron, another boron compound, or conducting metal boride. In certain embodiments, boron atoms present in the boron-containing layer comprise at least 21% $^{10}B$.

In certain embodiments, the intermediate diamond layer comprises a first intrinsic diamond sublayer and a second intrinsic diamond sublayer; a boron-containing layer is arranged between the first intrinsic diamond sublayer and the second intrinsic diamond sublayer; and the boron-containing layer comprises one or more of boron nitride, boron carbide, boron oxide, boron, or another boron compound. In certain embodiments, the p-type diamond layer comprises single crystal diamond material doped with boron at a first concentration; and the boron-containing layer comprises a p-type single crystal diamond material doped with boron at a second concentration, wherein the second concentration is less than the first concentration.

In certain embodiments, the device further comprises a conducting metal boride layer proximate to the n-type diamond layer and serving as a first contact; and a metal-containing layer proximate to the p-type diamond layer and serving as a second contact.

In certain embodiments, each of the p-type diamond layer and the intermediate diamond layer comprises single crystal material. In certain embodiments, each of the p-type diamond layer and the intermediate diamond layer comprises polycrystalline material. In certain embodiments, the p-type diamond layer is doped with boron. In certain embodiments, the n-type diamond layer is doped with phosphorus or nitrogen.

In certain embodiments, the intermediate diamond layer comprises intrinsic diamond material. In certain embodiments, the intermediate diamond layer comprises p-type diamond material having a second p-type dopant concentration that is less than the first p-type dopant concentration.

In certain embodiments, the device is configured to operate at an applied voltage of greater than or equal to 0 V. In certain embodiments, the device is configured for detection of one or more of neutrons, protons, alpha particles, or beta particles. In certain embodiments, the device is configured for detection of one or more of X-rays, ultraviolet rays, gamma rays, or photons.

In another aspect, the disclosure relates to a diode-based detector device comprising: a p-type diamond layer having a first p-type dopant concentration; an intermediate diamond layer comprising (a) intrinsic diamond material or (b) p-type diamond material having a second p-type dopant concentration that is less than the first p-type dopant concentration; and a Schottky contact arranged proximate to the intermediate diamond layer; wherein the diode-based detector device further comprises at least one of the following features (i) or (ii): (i) a boron-containing layer is arranged proximate to at least one of the intermediate diamond layer or the Schottky contact, wherein the boron-containing layer comprises one or more of boron nitride, boron carbide, boron oxide, boron, another boron compound, or a conducting metal boride; or (ii) the intermediate diamond layer comprises a thickness in a range of from 10 nm to 300 microns. In certain embodiments, the device comprises feature (i). In certain embodiments, the device comprises feature (ii). In further embodiments, the device comprises features (i) and (ii).

In certain embodiments, the device further comprises an ohmic contact arranged proximate to the p-type diamond layer. In certain embodiments, the Schottky contact is arranged between the p-type diamond layer and the boron-containing layer.

In certain embodiments, boron atoms present in the boron-containing layer comprise at least 21% $^{10}$B.

In certain embodiments, each of the p-type diamond layer and the intermediate diamond layer comprises single crystal material (optionally having a crystallographic orientation of (111), (100), or another orientation). In certain embodiments, each of the p-type diamond layer and the intermediate diamond layer comprises polycrystalline material.

In certain embodiments, the intermediate diamond layer comprises intrinsic diamond material. In certain embodiments, the intermediate diamond layer comprises p-type diamond material having a second p-type dopant concentration that is less than the first p-type dopant concentration.

In certain embodiments, the intermediate diamond layer comprises a thickness in a range of from 10 nanometers to 5 microns, or in a range of from 6 microns to 300 microns.

In certain embodiments, the device is configured for detection of one or more of neutrons, protons, alpha particles, or beta particles. In certain embodiments, the device is configured for detection of one or more of X-rays, ultraviolet rays, gamma rays, or photons. In certain embodiments, the device is configured to operate at an applied voltage of greater than or equal to 0 V.

In another aspect, the disclosure relates to a diode-based energy harvesting device comprising: at least one p-i-n stack comprising a p-type diamond layer, a n-type diamond layer, and an intrinsic diamond layer arranged between the p-type diamond layer and the n-type diamond layer; and a radioisotope source arranged proximate to the at least one p-i-n stack.

In certain embodiments, the radioisotope source is located closer to the n-type diamond layer than to the p-type diamond layer of the at least one p-i-n stack. In certain embodiments, the at least one p-i-n stack comprises a first p-i-n stack and a second p-i-n stack; and the radioisotope source is arranged between the first p-i-n stack and the second p-i-n stack.

In certain embodiments, the radioisotope source comprises a radioactive isotope foil. In certain embodiments, the radioactive isotope foil comprises at least one of tritium, nickel-63, promethium-147, technetium-99, plutonium-238, curium-242, curium-244, or strontium-90. In certain embodiments, the radioisotope source comprises carbon-14, which may be provided in non-diamond layer, or may be incorporated into one or more diamond layers of the diode-based detector device.

In certain embodiments, the intrinsic diamond layer comprises a thickness sufficient to substantially block transmission of incident radiation or energetic radiation particles emitted by the radioisotope source.

In certain embodiments, each p-i-n stack further comprises a first metal-containing contact adjacent to the n-type diamond layer, and a second metal-containing contact adjacent to the p-type diamond layer; and in each p-i-n stack, the p-type diamond layer is arranged between the first metal-containing contact and the intrinsic layer, and the n-type diamond layer is arranged between the second metal-containing contact and the intrinsic layer.

In certain embodiments, the first metal-containing contact comprises an ohmic contact, and the second metal-containing contact comprises an ohmic contact. In certain embodiments, the first metal-containing contact comprises a Schottky contact, and the second metal-containing contact comprises an ohmic contact.

In certain embodiments, each of the p-type diamond layer, the n-type diamond layer, and the intrinsic diamond layer comprises single crystal material. In certain embodiments, each of the p-type diamond layer, the n-type diamond layer, and the intrinsic diamond layer comprises polycrystalline material.

In certain embodiments, the p-type diamond layer is doped with boron, and the n-type diamond layer is doped with phosphorus or nitrogen.

In certain embodiments, the device is configured to operate at an external bias of 0 V In another aspect, the disclosure relates to a diode-based energy harvesting device comprising: at least one p-i stack comprising a p-type diamond layer having a first p-type dopant concentration; an intermediate diamond layer comprising (a) intrinsic diamond material or (b) p-type diamond material having a second p-type dopant concentration that is less than the first p-type dopant concentration; and a Schottky contact arranged proximate to the intermediate diamond layer; and a radioisotope source arranged proximate to the at least one p-i stack.

In certain embodiments, the radioisotope source is located closer to the Schottky contact than to the p-type diamond layer of the at least one p-i stack. In certain embodiments, the at least one p-i stack comprises a first p-i stack and a second p-i stack; and the radioisotope source is arranged between the first p-i stack and the second p-i stack.

In certain embodiments, each p-i stack further comprises an ohmic contact arranged proximate to the p-type diamond layer.

In certain embodiments, the radioisotope source comprises a radioactive isotope foil. In certain embodiments, the radioactive isotope foil comprises at least one of tritium, nickel-63, promethium-147, technetium-99, plutonium-238, curium-242, curium-244, or strontium-90. In certain embodiments, the radioisotope source comprises carbon-14.

In certain embodiments, the intermediate diamond layer comprises a thickness sufficient to substantially block transmission of incident radiation or energetic radiation particles emitted by the radioisotope source.

In certain embodiments, each of the p-type diamond layer and the intermediate diamond layer comprises single crystal material. In certain embodiments, each single crystal material comprises a crystallographic orientation of (111) or (100). In certain embodiments, each of the p-type diamond layer and the intermediate diamond layer comprises polycrystalline material.

In certain embodiments, the intermediate diamond layer comprises intrinsic diamond material. In certain embodiments, the intermediate diamond layer comprises p-type diamond material having a second p-type dopant concentration that is less than the first p-type dopant concentration.

In certain embodiments, the device is configured to operate at an external bias of 0 V.

In another aspect, any one or more aspects or features described herein may be combined with any one or more other aspects or features for additional advantage. In certain embodiments, biomarkers other than glucose monitoring chemistries may be used to enable sensing of other constituents of fluid samples.

Other aspects and embodiments will be apparent from the detailed description and accompanying drawings.

DETAILED DESCRIPTION

Figure 1:
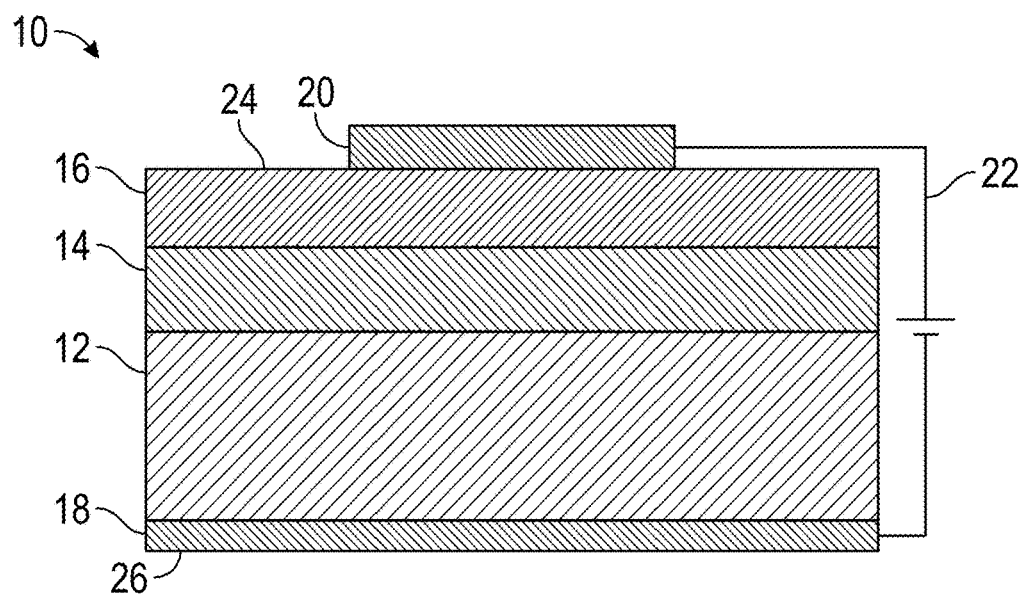
FIG. 1 is a side cross-sectional schematic view of a diamond diode device of a vertical type, having metal-containing contacts on opposing upper and lower sides thereof, and including sequentially arranged P-type, intrinsic, and N-type diamond layers between the contacts.

As noted previously, aspects of the present disclosure relate to diamond diode-based devices configured to convert radiation energy into electrical current, which can be used for sensing (i.e., detection) or delivered to a load (i.e., energy harvesting).

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It should be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It should also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

It should be understood that, although the terms "upper," "lower," "bottom," "intermediate," "middle," "top," and the like may be used herein to describe various elements, these elements should not be limited by these terms. These terms are only used to distinguish one element from another. For example, a first element could be termed an "upper" element and, similarly, a second element could be termed an "upper" element depending on the relative orientations of these elements, without departing from the scope of the present disclosure.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

In semiconductor production, doping is the intentional introduction of impurities into an intrinsic semiconductor for the purpose of modulating its electrical, optical, and/or structural properties. The term "intrinsic" as applied to diamond may be considered synonymous with "undoped"; however, recognizing that it is very difficult to completely eliminate trace amounts of impurities encountered in diamond growth processes (e.g., HPHT and VPE), the term "intrinsic" applied to diamond as used herein may also encompass "unintentionally doped" diamond material.

In certain embodiments, low-doped p-type diamond material may be substituted for intrinsic diamond material. In this context, "low-doped p-type material" refers to diamond material having p-type carrier (e.g., boron) atoms in a concentration of no greater than about $5 \times 10^{15}$ cm$^{-3}$, or no greater than about $1 \times 10^{15}$ cm$^{-3}$, or no greater than about $5 \times 10^{14}$ cm$^{-3}$.

An ohmic contact as described herein is a non-rectifying electrical junction, exhibiting a linear (or substantially linear) current-voltage curve. One example of an ohmic contact suitable for use with diamond devices includes a Ti/Pt/Au electrode. A Schottky contact is a non-ohmic, metal-semiconductor contact having a large barrier height, formed when the underlying semiconductor has a lower work function than the contact metal. Schottky barrier height may be adjusted by various conventional means such as (but not limited to): chemical treatment (e.g., etching) of a diamond surface prior to contact formation to affect diamond surface termination, adjusting material composition of one or more contact materials (which may be in discrete layers), addition of doping material at the metal/diamond interface, and/or thermal treatment (e.g., annealing) of contact material.

Unless otherwise defined, all terms (including technical and scientific terms) used herein have the same meaning as commonly understood by one of ordinary skill in the art to which this disclosure belongs. It will be further understood that terms used herein should be interpreted as having meanings that are consistent with their meanings in the context of this specification and the relevant art and will not be interpreted in an idealized or overly formal sense unless expressly so defined herein.

As noted previously, neutrons present a challenge to detect efficiently, since neutrons do not carry charge or interact with electrons directly. In order to detect neutrons, a nuclear reaction with a neutron that outputs a charged energetic particle must occur first. Most commonly, the nuclear reaction produces protons, alpha particles, gamma rays, and ions. In certain devices disclosed herein, boron-containing (e.g., boron-rich) layers are used as neutron conversion layers. In certain embodiments, a boron-containing layer may be provided in the form of a coating (e.g., a surface coating arranged over the surface of an underlying material). Boron naturally occurs as isotopes $^{10}$B and $^{11}$B, which occur naturally at 19.9% and 80.1%, respectively. $^{10}$B (specifically) has a high neutron capture cross section;

meaning there exists a high probability that $^{10}$B will pick up a neutron that collides with the nucleus. This probability changes with the energy level of the free neutron in question, where $^{10}$B has the highest chance to pick up slow (thermal) neutrons. The thermal neutron (~0.025 eV) cross section with $^{10}$B is 3837 barn. The most common reaction of thermal neutrons (~0.025 eV) with $^{10}$B generates alpha particles (He$^{2+}$) is predominantly given by the following equation.

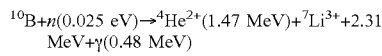

$$^{10}B+n(0.025 \text{ eV}) \rightarrow {}^4He^{2+}(1.47 \text{ MeV}) + {}^7Li^{3+} + 2.31 \text{ MeV} + \gamma(0.48 \text{ MeV})$$

The interaction of the high-energy byproducts of the foregoing reaction causes a secondary reaction with the detector to ionize or excite an atom. This excitation produces a current, which acts as the signal of the detector.

In certain aspects of the present disclosure, a diamond diode-based detector device includes a boron-containing layer (also termed a "converter") that is arranged to detect slow neutrons that are incident on the device. For instance, the detection of slow neutrons (e.g., having energies below 0.5 eV), can be effectively accomplished by depositing a thin layer (converter) of boron or boron-containing material onto a diamond diode that acts as the charged particle detector. Such diode may include a very thin intrinsic diamond layer to render the detector essentially insensitive to gamma radiation, providing a unique advantage relative to other neutron detectors. A diamond diode-based detector device including a boron-containing layer may also be used to detect fast neutrons, through a nuclear reaction that generates alpha particles in addition to other byproducts. In certain embodiments, boron (which may embody a higher proportion of $^{10}$B atoms than are present in naturally occurring boron) may be incorporated into a diamond diode-based device by boron doping of diamond, and/or by addition of at least one boron-containing non-diamond layer (e.g., boron nitride, boron carbide, boron oxide, boron, another boron compound, or a conducting metal boride).

In certain embodiments, the intrinsic diamond layer comprises a thickness in a range of from 10 nm to 300 µm, or from 10 nm to 10 µm, or from 10 nm to 5 µm, or from 10 nm to 1 µm, or from 100 nm to 300 µm or from 100 nm to 10 µm, or from 100 nm to 1 µm, or from 1 µm to 300 µm, or from 1 µm to 100 µm, or from 1 µm to 50 µm, or from 1 µm to 10 µm, or from 10 nm to 5 µm, or from 6 µm to 300 µm. The thickness of the intrinsic diamond layer may be adjusted to affect the sensitivity of a diode-based detector device to one or more different types of radioactive decay byproducts, such as one or more of neutrons, protons, alpha particles, beta particles, X-rays, ultraviolet rays, gamma rays, and photons. For detection of neutrons, an optimal thickness of a $^{10}$B layer is close to, but less than, the range of the 1.47 MeV α-particles in $^{10}$B which is just 3.62 µm. The range in diamond of the 1.47 MeV α-particle is very close to that in $^{10}$B so its detection can indeed be accomplished with a very thin p-i-n diamond diode.

Boron has two primary isotopes: $^{10}$B and $^{11}$B. $^{10}$B represents 19.9%, and $^{11}$B represents 80.1%, of naturally occurring boron. In certain embodiments, the boron-containing layer contains a higher proportion of $^{10}$B atoms than are present in naturally occurring boron to enhance N collection efficiency. In certain embodiments, boron atoms present in a boron-containing layer comprise at least 21% $^{10}$B, at least 25%, at least 30%, at least 35%, at least 40%, at least 45%, at least 50%, at least 60%, at least 70%, at least 80%, at least 90% $^{10}$B, at least 95% $^{10}$B, at least 99% $^{10}$B, or at least 99.9% $^{10}$B. In certain embodiments, a boron-containing layer comprises one or more of boron nitride, boron carbide, boron oxide, boron, a metal boride (optionally an electrically conducting metal boride), or another boron compound. In certain embodiments, an electrically conducting metal boride layer may serve as both a converter and an electrical contact.

The size of a diamond diode-based device suitable for neutron detection can be defined by the neutron capture layer area as it would vary according to the sensitivity to given neutron flux. The required thickness of neutron capture layer can be determined from maximum number of neutron interactions or signal obtained with respect to thickness.

Though other solid-state detectors have been described in the art, embodiments of the present disclosure may exhibit an improved ability to detect radiation in pulse mode (for more accurate particle counting), at high temperatures and in real time, to operate with high efficiency, and selectively detect neutrons (versus gamma rays), or to preferentially detect protons or alpha particles. As a result of an extremely high displacement energy and low Z, diamond exhibits extreme radiation hardness, which allows diamond devices to survive harsh radiation environments and results in meaningful improvements in precision and calibration. High thermal conductivity (22 W/cm K) facilitates operational temperatures higher than other solid-state detectors (e.g., up to 700° C.) and ultimately results in small device sizes by avoiding the need for cooling media. The large band gap of diamond also provides a large open-circuit voltage for solid-state radioisotope generators, and low thermal noise for radiation detectors.

Certain embodiments are directed to devices based on single-crystal (e.g., (111), (100) and another orientation) or polycrystalline diamond-based p-i-n structure, with an intrinsic diamond layer arranged between a p-type layer and an n-type layer. The p-i-n structure creates an internal electric field, which will separate generated electron-hole pairs and cause them to move in opposite directions, resulting in a net current which can be measured or utilized by an external circuit. Because this electric field is generated by the p-i-n structure, the diode-based detector devices can operate with zero external voltage. If higher charge collection efficiency is desired, then single-crystal diamond should be used.

In certain embodiments, a neutron conversion layer (e.g., boron-containing layer) is added to a diamond-based p-i-n structure. For higher conversion efficiency, the boron-containing layer may contain a higher proportion of $^{10}$B atoms than are present in naturally occurring boron. An alpha particle emitted by neutron and $^{10}$B interaction produces at least one electron-hole pair in intrinsic diamond, which is collected in the form of current signal. If the intrinsic diamond layer is sufficiently thin, then the sensitivity to gamma radiation may be reduced, thereby enabling more selective neutron detection. Diamond diode-based detectors have demonstrated charge collection length (for both electrons and holes) that exceeds 200 um (the sample thickness) at an applied field of less than 0.5 V/µm.

In certain embodiments, a diamond diode-based detector device may be configured to preferentially detect alpha particles or protons. In such an embodiment, the intrinsic layer may be thin (e.g., 1-10 µm, or 4-6 µm, or another suitable thickness range) to allow efficient collection of charge, reduce recombination, and reduce sensitivity to gamma radiation. Interface band alignment of a diamond diode-based detector device facilitates detection of charge created by proton and alpha interaction. A diamond diode-based detector may be made of single crystal or polycrystalline diamond. Because of the thin intrinsic layer, polycrystalline diamond cause minimal reduction in device performance since there would be few grain boundaries to trap charge (as compared to a thick polycrystalline diamond intrinsic layer). Such a device may be devoid of a neutron conversion layer, or a neutron conversion layer may be provided.

In certain embodiments, a diamond diode-based detector device may include a p-i-m (i.e., "p-type, intrinsic, metal") structure in which an intrinsic layer is provided between a p-type layer and a Schottky contact (which includes a metal).

Before illustrating structures having boron-containing conversion layers, diamond diode structures of various types will be introduced in connection with FIGS. 1-5. In suitable embodiments, such diode structures may be used as detectors, or may be incorporated into detectors or energy harvesting devices. It is to be appreciated that multiple devices may be fabricated in parallel on a single substrate, if desired.

FIG. 1 is a side cross-sectional schematic view of a diamond diode device 10 of a vertical type, having a p-type (e.g., heavily p-type) diamond layer 12, an intrinsic diamond layer 14, and an n-type diamond layer 16 arranged between metal-containing contacts 18, 20. The intrinsic diamond layer 14 is intermediate to the p-type diamond layer 12 and the n-type diamond layer 16, and may therefore be referred to as an "intermediate diamond layer" herein. The diamond layers 12, 14, 16 may be fabricated by CVD, and the metal-containing contacts 18, 20 may be fabricated by e-beam deposition, sputtering, or any other suitable metal deposition technique. The intrinsic diamond layer 14 may have a thickness value according to one of the thickness ranges specified herein. The diamond diode device 10 is of a vertical type, with the metal-containing contacts 18, 20 separately provided on the lower side 26 and the upper side 24, respectively, of the diamond diode device 10. In certain embodiments, the p-type diamond layer 12, intrinsic diamond layer 14, and n-type diamond layer 16 each comprise single crystal (e.g., (111), (100), or other orientation) diamond, with the p-type diamond layer 12 incorporating a p-type dopant (e.g., B), and with the n-type diamond layer 16 incorporating a n-type dopant (e.g., P or N). Leads 22 may be provided to couple the contacts 18, 20 with an external circuit (not shown). In certain embodiments, the p-type diamond layer 12, intrinsic diamond layer 14, and n-type diamond layer 16 each comprise polycrystalline material.

Figure 2:
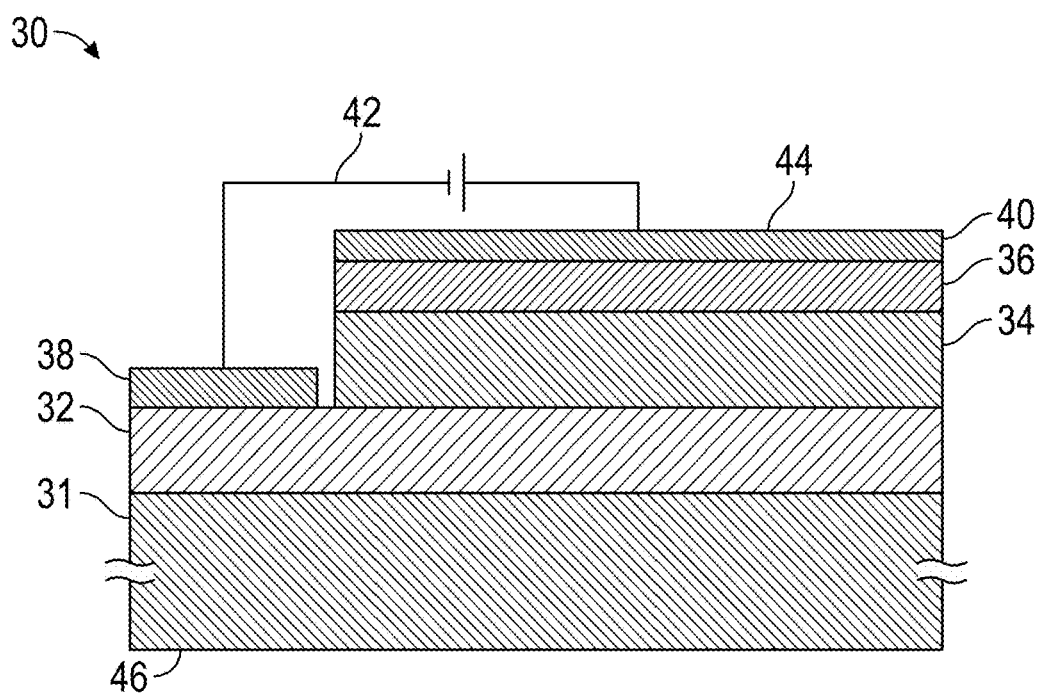
FIG. 2 is a side cross-sectional schematic view of a diamond diode device of a quasi-vertical type, having metal-containing first and second contacts accessible from an upper side thereof, and including sequentially arranged p-type, intrinsic, and n-type diamond layers.

FIG. 2 is a side cross-sectional schematic view of a diamond diode device 30 of a quasi-vertical type, having an intrinsic diamond substrate 31, a p-type diamond layer 32, an intrinsic diamond layer 34, and an n-type diamond layer 36 as well as two metal-containing contacts 38, 40. The intrinsic diamond layer 34 may be referred to as an "intermediate diamond layer" herein, and may have a thickness value according to one of the thickness ranges specified herein. Both metal-containing contacts 38, 40 are accessible along an upper side 44 of the device 30, which opposes a lower side 46 thereof. In certain embodiments, the p-type diamond layer 32, intrinsic diamond layer 34, and n-type diamond layer 36 each comprise single crystal (e.g., (111), (100), or other orientation) diamond, with the p-type diamond layer 32 incorporating a p-type dopant (e.g., boron), and with the n-type diamond layer 36 incorporating a n-type dopant (e.g., phosphorus or nitrogen). In certain embodiments, the p-type diamond layer 32, intrinsic diamond layer 34, and n-type diamond layer 36 each comprise polycrys-talline material. Leads 42 may be provided to couple the metal-containing contacts 38, 40 with an external circuit (not shown).

To take advantage of the single-crystal diamond properties—such as high breakdown field, high hole and electron mobility, and high thermal conductivity—p-type single-crystal diamond may be used as an initial substrate in certain embodiments. Single-crystal intrinsic diamond and single crystal n-type diamond layers may then be deposited using plasma-enhanced chemical vapor deposition (PECVD). The intrinsic region will become conducting due to charge carriers injected by n- and p-type diamond with applied voltage. The wide band gap of intrinsic diamond enables near zero dark current at room temperature; accordingly, the dark current in diamond p-i-n diodes is zero. By varying the thickness of the intrinsic diamond layer, the breakdown voltage of a p-i-n diode device can be tuned. In addition, the material properties of intrinsic diamond make it the ideal material to withstand extremely high voltages and efficiently conduct both electron and hole currents.

Figure 3:
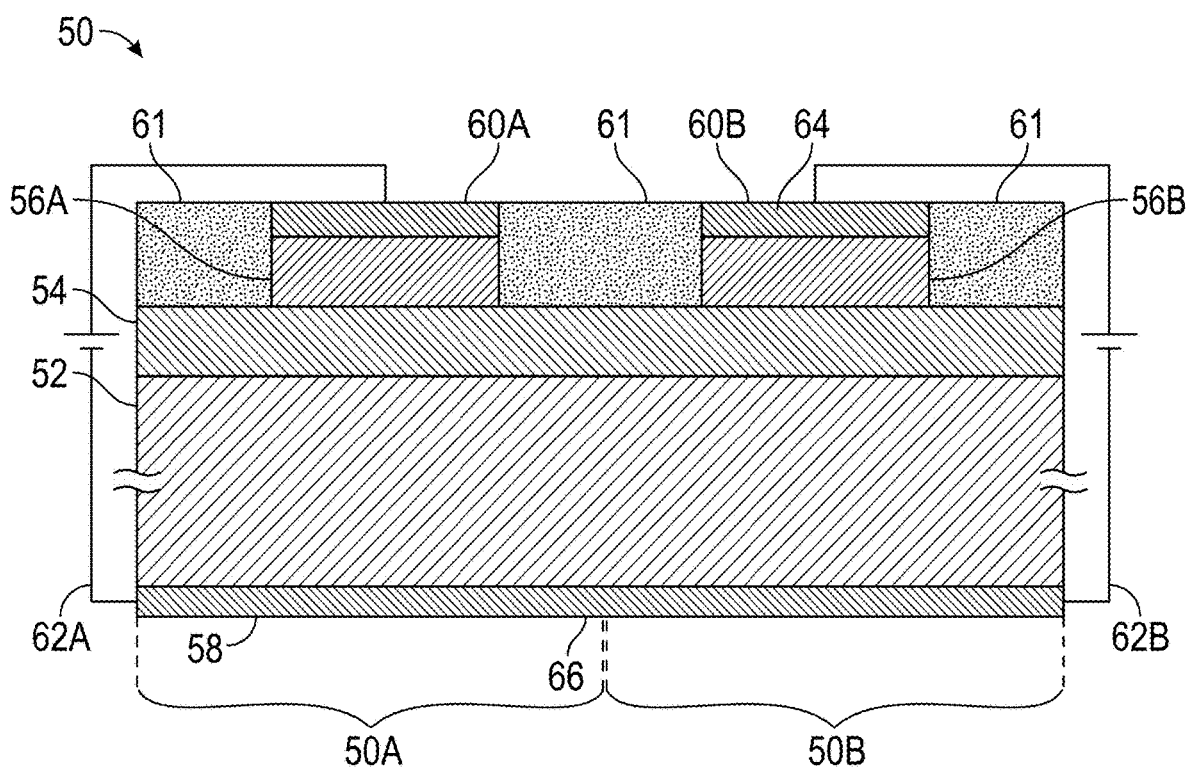
FIG. 3 is a side cross-sectional schematic view of two vertical-type diamond diode devices fabricated in parallel and having metal-containing contacts on opposing upper and lower sides thereof, with insulating material laterally arranged between contacts of the respective diode devices, and including sequentially arranged P-type, intrinsic, and N-type diamond layers.

FIG. 3 is a side cross-sectional schematic view of an array device 50 including two vertical-type diamond diodes 50A, 50B fabricated in parallel and physically interconnected by (at least) an intermediately arranged intrinsic diamond layer 54. Each diode 50A, 50B includes a portion of the p-type diamond layer 52, a portion of the intrinsic diamond layer 54, and a n-type diamond layer region 56A, 56B, with the foregoing (i.e., p-i-n) diamond layers arranged between lower metal-containing contact 58 (along a lower side 66 of the array device 50) and upper metal-containing contacts 60A, 60B (along an upper side 64 of the array device 50). As shown, n-type diamond layer regions 56A, 56B are separated from one another, and upper metal-containing contacts 60A, 60B are separated from one another, by segregating regions 61 that are optionally filled with insulating material. In certain embodiments, the segregating regions 61 may be formed by conventional methods such as photolithographic patterning and etching, or by sawing (e.g., using a wire saw). In certain embodiments, multiple lower metal-containing contacts may be provided and arranged in parallel, and multiple upper metal-containing contacts may be provided and arranged in parallel, with the lower contacts extending in a lengthwise direction perpendicular to a lengthwise direction of the upper contacts. Such a configuration may provide overlapping "stripes" of contacts that permit diode regions at intersections of the contacts to be operated simultaneously (e.g., as radioactive decay product detectors or energy harvesting devices). In certain embodiments, the p-type diamond layer 52, intrinsic diamond layer 54, and n-type diamond layer regions 56A, 56B each comprise single crystal (e.g., (111), (100), or other orientation) diamond, with the p-type diamond layer 52 incorporating a p-type dopant (e.g., boron), and with the n-type diamond layer 56 incorporating a n-type dopant (e.g., phosphorus or nitrogen). Leads 62A, 62B may be provided to couple contact pairs 58, 60A and 58, 60B, respectively, with external circuits (not shown).

Although FIG. 3 depicts an array device 50 incorporating multiple diamond diodes 50A, 50B of a vertical type, it is to be appreciated that in other embodiments, array devices may include multiple diamond diodes of a quasi-vertical type, such as shown in FIG. 2.

Figure 4:
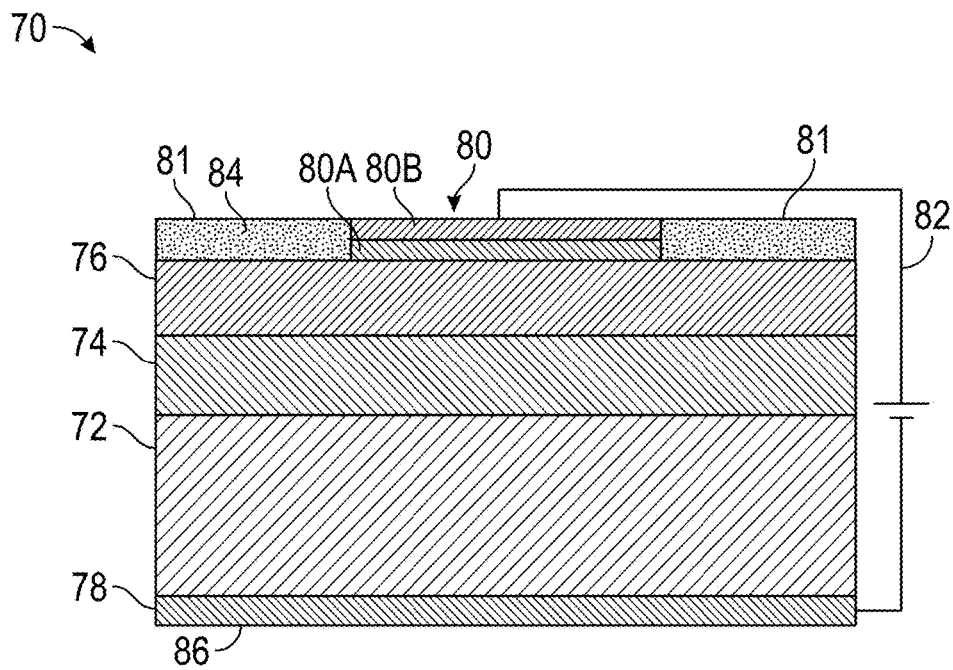
FIG. 4 is a side cross-sectional schematic view of a vertical-type diamond diode device including a Schottky contact arranged between insulating material regions along an upper side, including an ohmic contact arranged along a lower side, and including sequentially arranged P-type, intrinsic, and N-type diamond layers between the contacts.

FIG. 4 is a side cross-sectional schematic view of a vertical-type diamond diode device 70 including a p-type diamond layer 72, an intrinsic diamond layer 74, and an n-type diamond layer 76 arranged between a Schottky contact 80 (along an upper side 84) and an ohmic contact 78

(along a lower side 86). The Schottky contact 80 is further arranged (laterally) between insulating material regions 81 along the upper side 84. In certain embodiments, the Schottky contact 80 may include a thin barrier metal layer 80A proximate to the n-type diamond layer 76, and an electrical contact metal layer 80B overlying the barrier metal layer 80A. In such an embodiment, the barrier metal layer 80A should be sufficiently thin enough to enable passage of radioactive decay products of interest. In certain embodiments, the p-type diamond layer 72, intrinsic diamond layer 74, and n-type diamond layer 76 each comprise single crystal (e.g., (111), (100), or other orientation) diamond, with the p-type diamond layer 72 incorporating a p-type dopant (e.g., boron), and with the n-type diamond layer 76 incorporating a n-type dopant (e.g., phosphorus or nitrogen). Leads 82 may be provided to couple the contacts 78, 80 with an external circuit (not shown). The diamond diode device 70 includes p-i-n layers 72, 74, 76 in combination with a Schottky contact 80, and may therefore be considered a Schottky/p-i-n diode device.

Figure 5:
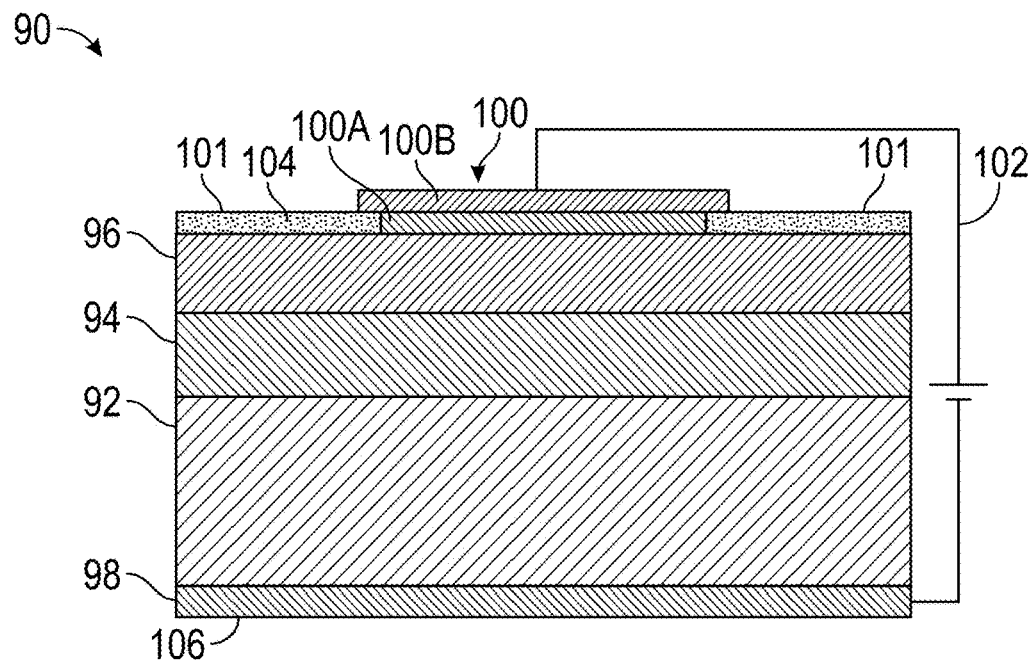
FIG. 5 is a side cross-sectional schematic view of a vertical-type diamond diode device including a Schottky contact arranged partially between and partially overlapping insulating material regions along an upper side, including an ohmic contact arranged along a lower side, and including P-type, intrinsic, and N-type diamond layers between the contacts.

FIG. 5 illustrates a vertical-type Schottky/p-i-n diamond diode device 90 similar to the device 70 of FIG. 4, but with a portion of the Schottky contact 100 overlapping the insulating material regions 101 along an upper side 104 of the Schottky/p-i-n diamond diode device 90. The Schottky/p-i-n diamond diode device 90 includes a p-type diamond layer 92, an intrinsic diamond layer 94, and an n-type diamond layer 96 arranged between a Schottky contact 100 (along the upper side 104) and an ohmic contact 98 (along a lower side 106). The Schottky contact 100 is further arranged (laterally) between insulating material regions 101 along the upper side 104. In certain embodiments, the Schottky contact 100 may include a thin barrier metal layer 100A proximate to the n-type diamond layer 96, and an electrical contact metal layer 100B overlying the barrier metal layer 100A, with portions of the electrical contact metal layer 100B extending laterally to overlap portions of the insulating material regions 101. In certain embodiments, the p-type diamond layer 92, intrinsic diamond layer 94, and n-type diamond layer 96 each comprise single crystal (e.g., (111), (100), or other orientation) diamond, with the p-type diamond layer 92 incorporating a p-type dopant (e.g., boron), and with the n-type diamond layer 96 incorporating a n-type dopant (e.g., phosphorus or nitrogen). Leads 102 may be provided to couple the contacts 98, 100 with an external circuit (not shown).

Various modifications may be made to the devices depicted in FIGS. 1-5 within the scope of the present disclosure. In certain embodiments, the n-type diamond layer (16, 36, 56A, 56B, 76, 96) may include n-type sublayers of different doping levels (e.g., a n+ layer and a p-layer) proximate to one another, to yield a p-i-n$^+$n$^-$ device. In further embodiments, the intrinsic layer may be replaced with a low-doped p-type material layer (e.g., a p$^-$ layer).

Further modifications may be made to the devices depicted in FIGS. 4 and 5 within the scope of the present disclosure. In recognition that the Schottky contacts 80, 100 may be used in place of an n-type layer, in certain embodiments the n-type layer 76 of FIG. 4 and the n-type layer 96 of FIG. 5 may be omitted, to yield a p-i-m structure in each instance. In further embodiments, the intrinsic layer may be replaced with a low-doped p-type material layer (e.g., a p$^{--}$ layer). Moreover, any of the diamond diodes of FIGS. 1-5 may be modified to incorporate a boron-containing conversion layer (e.g., adjacent to a contact, in lieu of a contact, within an intrinsic layer, or in any other suitable position).

Having introduced diamond diode structures of various types, diamond diode-based detector devices incorporating boron-containing conversion layers will now be described in connection with FIGS. 6-9.

Figure 6:
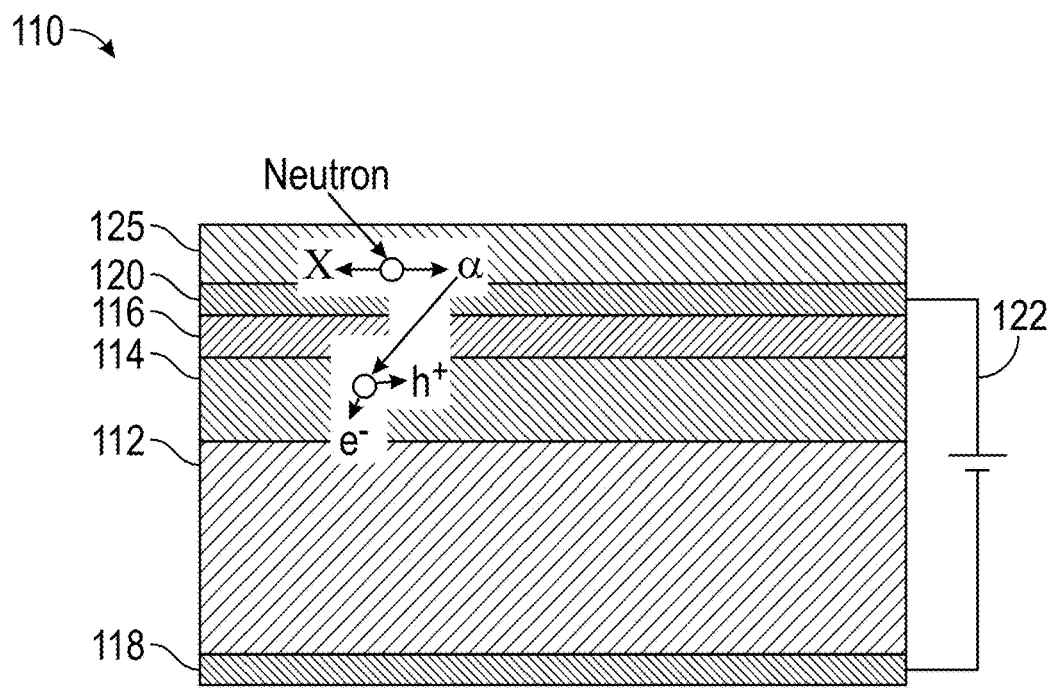
FIG. 6 is a side cross-sectional schematic view of a diamond diode-based detector device according to certain embodiments of the present disclosure, including sequentially arranged P-type, intrinsic, and N-type diamond layers arranged between metal-containing contacts, and including a (non-diamond) boron-containing layer (e.g., including boron nitride, boron carbide, boron oxide, boron, or another boron compound) arranged over one contact proximate to the N-type diamond layer.

FIG. 6 is a side cross-sectional schematic view of a diamond diode-based detector device 110 according to certain embodiments of the present disclosure. The diamond diode-based detector device 110 includes a p-type diamond layer 112, an intrinsic diamond layer 114, and an n-type diamond layer 116 arranged between metal-containing (e.g., ohmic) contacts 120, 118, with the device further including a (non-diamond) boron-containing layer 125 proximate to one contact 120 nearest the n-type diamond layer 116. FIG. 6 also schematically shows the effect of absorption of a neutron by the boron-containing layer 125, which leads to neutron reaction byproducts (such as Li, illustrated as "X") and alpha particles (illustrated as a), interaction of such byproducts with the intrinsic diamond layer 114 leads to excitation of electron-hole pairs (h$^+$ and e$^-$) that results in a current. Leads 122 may be provided to couple the contacts 118, 120 with an external circuit (not shown).

Figure 7:
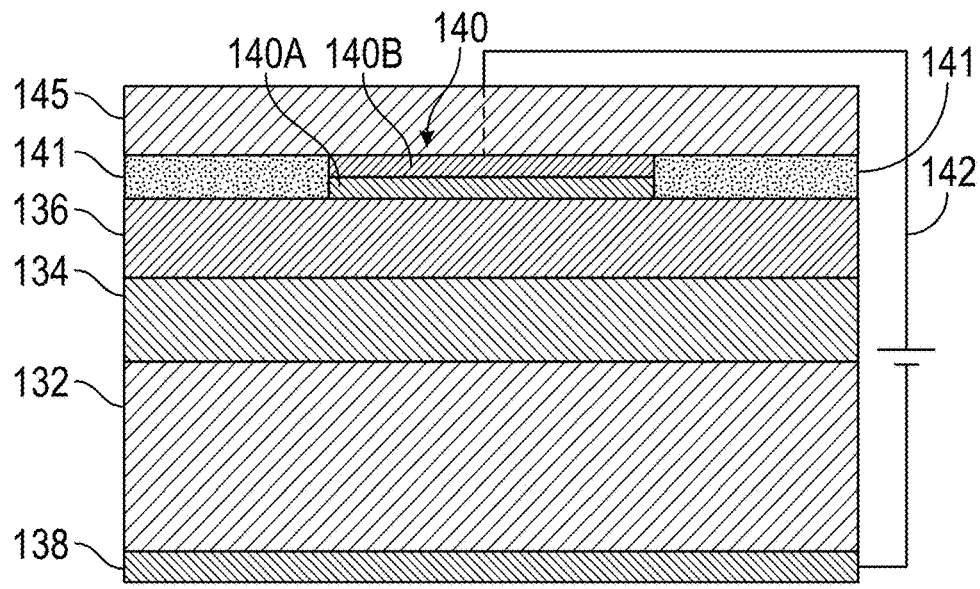
FIG. 7 is a side cross-sectional schematic view of a diamond diode-based detector device according to certain embodiments of the present disclosure, including sequentially arranged P-type, intrinsic, and N-type diamond layers arranged between a lower ohmic contact and an upper Schottky contact, and including a (non-diamond) boron-containing layer (e.g., including boron nitride, boron carbide, boron oxide, boron, or another boron compound) arranged over the Schottky contact.

FIG. 7 is a side cross-sectional schematic view of a diamond diode-based detector device 130 according to certain embodiments of the present disclosure. The diamond diode-based detector device 130 includes a p-type diamond layer 132, an intrinsic diamond layer 134, and an n-type diamond layer 136 arranged between an ohmic contact 138 and a Schottky contact 140. In certain embodiments, the Schottky contact 140 may include a thin barrier metal layer 140A proximate to the n-type diamond layer 136, and an electrical contact metal layer 140B overlying the barrier metal layer 140A. The Schottky contact 140 is further arranged (laterally) between insulating material regions 141 overlying the n-type diamond layer 136. The diamond diode-based detector device 130 further includes a (non-diamond) boron-containing layer 145 overlying the Schottky contact 140 and the insulating material regions 141. The boron-containing layer 145 may include boron nitride, boron carbide, boron oxide, boron, or another boron compound. Leads 142 may be provided to couple the contacts 138, 140 with an external circuit (not shown).

With reference to FIGS. 6 and 7, in certain embodiments, the p-type diamond layer 112, 132, the intrinsic diamond layer 114, 134, and the n-type diamond layer 116, 136 may each comprise single crystal (e.g., (111), (100), or other orientation) diamond material. In other embodiments, the p-type diamond layer 112, 132, the intrinsic diamond layer 114, 134, and the n-type diamond layer 116, 136 may each comprise polycrystalline diamond material.

With further reference to FIGS. 6 and 7, in certain embodiments, the intrinsic diamond layer 114, 134 may comprises a thickness in a range of from 10 nm to 300 microns (or in another range as specified herein); the boron-containing layer 125, 145 may comprise one or more of boron nitride, boron carbide, boron oxide, another boron compound; and/or boron atoms present in the boron-containing layer comprise at least 21% $^{10}$B (or another threshold specified herein). Although the diamond diode-based detector devices 110, 130 of FIGS. 6 and 7 are shown as embodying vertical diodes, it is to be appreciated that such devices may be formed as quasi-vertical devices (similar to FIG. 2) in certain embodiments. Further, although the detector devices 110, 130 of FIGS. 6 and 7 each show a boron-containing layer 125, 145 arranged proximate to a contact 120, 140 that is adjacent to a n-type diamond layer 116, 136, in certain embodiments a boron-containing layer may be arranged proximate to a contact 118, 138 that is adjacent to a p-type diamond layer 112, 132 (instead of proximate to a contact that is adjacent to the n-type diamond layer).

Figure 8:
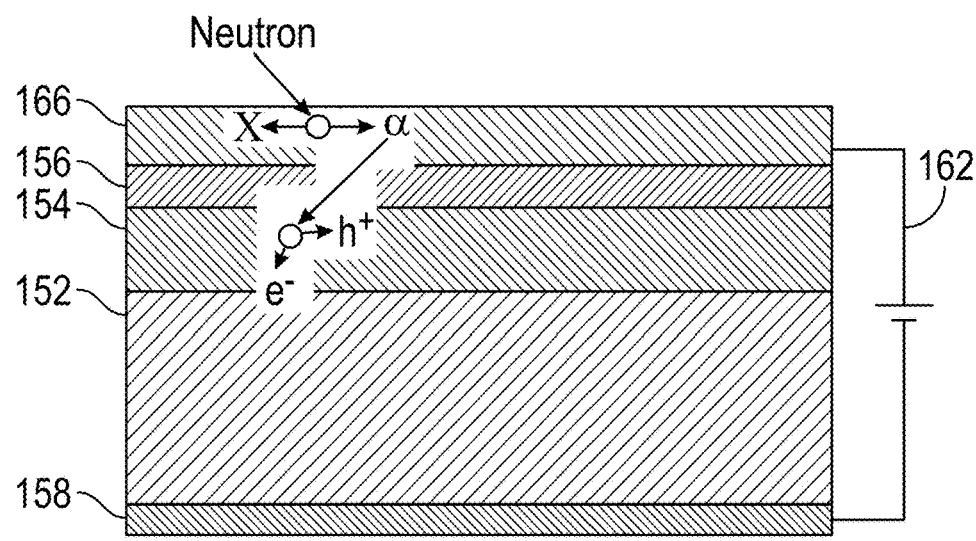
FIG. 8 is a side cross-sectional schematic view of a diamond diode-based detector device according to certain embodiments of the present disclosure, including sequentially arranged P-type, intrinsic, and N-type diamond layers arranged between a lower ohmic contact and a conducting metal boride layer that serves as an upper contact.

In certain embodiments, a conducting boron-containing layer may serve as both an electrical contact and a neutron capture layer (or converter). FIG. 8 is a side cross-sectional schematic view of a diamond diode-based detector device 150 according to certain embodiments of the present disclosure, including a p-type diamond layer 152, an intrinsic diamond layer 154, and an n-type diamond layer 156 that are arranged between a lower metal-containing (e.g., ohmic) contact 158 and a conducting metal boride layer 166 that serves as an upper contact 166. The conducting metal boride layer 166 may include any suitable metal boride. FIG. 8 also schematically shows the effect of absorption of a neutron by the conducting metal boride layer 166, which leads to neutron reaction byproducts (such as Li, illustrated as "X") and alpha particles (illustrated as a), and interaction of such byproducts with the intrinsic diamond layer 154 leads to excitation of electron-hole pairs ($h^+$ and $e^-$) that results in an electric current. Leads 162 may be provided to couple the lower metal-containing contact 158 and the conducting metal boride layer 166 with an external circuit (not shown). In certain embodiments, boron atoms present in the conducting metal boride layer 166 comprise at least 21% $^{10}$B (or another threshold specified herein). Although the diode-based detector device 150 of FIG. 8 shows the conducting metal boride layer 166 arranged proximate to the n-type diamond layer 156, in certain embodiments a conducting metal boride layer may be used to replace the lower metal-containing contact 158 adjacent to the p-type diamond layer 152 instead.

In certain embodiments, the p-type diamond layer 152, the intrinsic diamond layer 154, and the n-type diamond layer 156 may each comprise single crystal (e.g., (111), (100), or other orientation) diamond material. In other embodiments, the p-type diamond layer 152, the intrinsic diamond layer 154, and the n-type diamond layer 156 may each comprise polycrystalline diamond material. In certain embodiments, the intrinsic diamond layer 154 may comprise a thickness in a range of from 10 nm to 300 microns (or in another range as specified herein).

Figure 9:
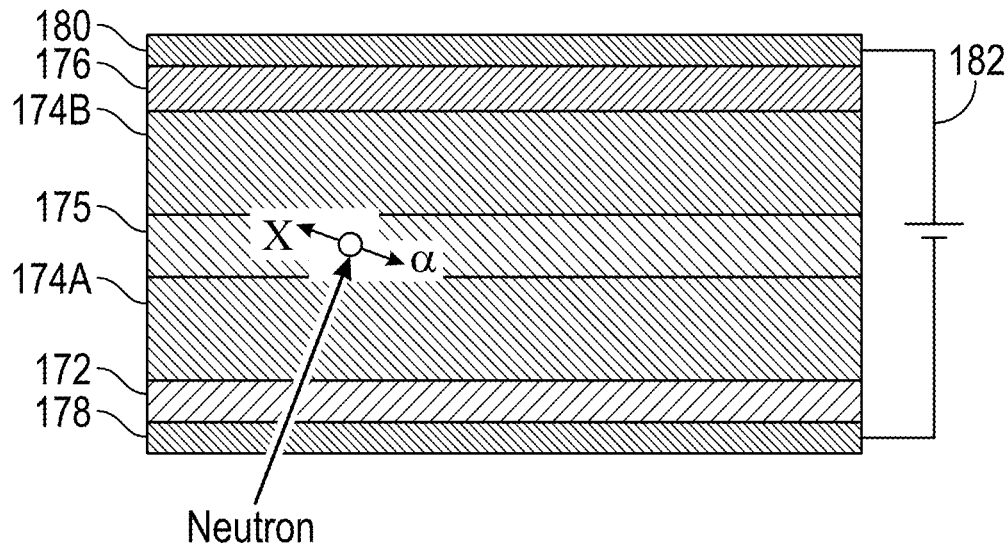
FIG. 9 is a side cross-sectional schematic view of a diamond diode-based detector device according to certain embodiments of the present disclosure, including sequentially arranged P-type, intrinsic, and N-type diamond layers arranged between a metal-containing contact, with the intrinsic layer including first and second diamond intrinsic sublayers, and a boron-containing layer arranged between the first and second diamond intrinsic sublayers.

In certain embodiments, a diamond diode-based detector device may include an intrinsic diamond layer that is segregated into two sublayers, with a boron-containing conversion layer being arranged between the sublayers. FIG. 9 is a side cross-sectional schematic view of a diamond diode-based detector device 170 according to certain embodiments of the present disclosure. The diode-based detector device 170 includes a p-type diamond layer 172, two intrinsic diamond sublayers 174A, 174B, and an n-type diamond layer 176 that are arranged between first and second contacts 178, 180 A boron-containing conversion layer 175 is arranged between the two intrinsic diamond sublayers 174A, 174B. In certain embodiments, the boron-containing conversion layer 175 is thinner than each of intrinsic diamond sublayers 174A, 174B. The p-type diamond layer 172 may be doped with boron, and the n-type diamond layer 176 may be doped with phosphorus or nitrogen.

With continued reference to FIG. 9, in one embodiment the p-type diamond layer 172, intrinsic diamond sublayers 174A, 174B, and the n-type diamond layer 176 each comprise single crystal diamond material (e.g., having a crystallographic orientation of (111), (100), or another orientation). In certain embodiments, the boron-containing conversion layer 175 comprises boron doped p-type single crystal diamond material (e.g., (111), (100), or other orientation), wherein the p-type doping level of the boron-containing layer 175 is lower than a p-type doping level of the p-type layer 172. For example, the p-type layer 172 may be a $p^{++}$ layer, and the boron-containing layer may be a $p^-$ layer. In certain embodiments, the p-type diamond layer 172, intrinsic diamond sublayers 174A, 174B, and the n-type diamond layer 176 each comprise polycrystalline diamond material, and the boron-containing conversion layer 175 comprises one or more of boron nitride, boron carbide, boron oxide, boron, or another boron compound. In certain embodiments, boron atoms present in the boron-containing layer 175 comprise at least 21% $^{10}$B (or another threshold specified herein).

FIG. 9 also schematically shows the effect of absorption of a neutron by the boron-containing conversion layer 175, which leads to neutron reaction byproducts (such as Li, illustrated as "X") and alpha particles (illustrated as a), and interaction of such byproducts with the intrinsic diamond sublayers 174A, 174B leads to excitation of electron-hole pairs ($h^+$ and $e^-$) that results in an electric current. Leads 182 may be provided to couple the lower contact 178 and the upper contact 180 with an external circuit (not shown).

In certain embodiments, a p-i-n diamond detector may be devoid of a boron-containing conversion layer, but an intrinsic layer thereof (either single crystal or polycrystalline diamond) may act as an active layer for incident protons and/or alpha particles. In certain embodiments, an intrinsic layer may be optimized to match the absorption depth (about 5 μm) of approximately 2 MeV alpha particles. The thin intrinsic layer would be sensitive to alpha particles and protons, but exhibit reduced or minimal sensitivity to other charged particles and gamma radiation. Contacts (e.g., metal-containing contacts) on the n-type and p-type diamond layers of the p-i-n diamond detector may be provided to collect charge generated in the intrinsic layer. Charge created in intrinsic layer is collected efficiently, as a result of induced electric field across thin intrinsic layer p-i-n diamond structure, in the form of radiation signal.

Figure 10:
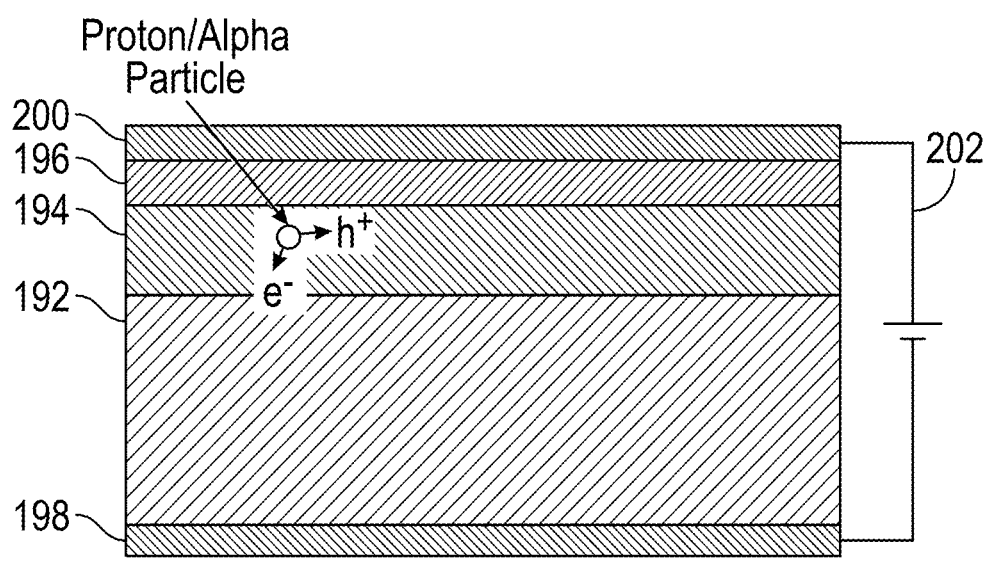
FIG. 10 is a side cross-sectional schematic view of a diamond diode-based detector device according to certain embodiments of the present disclosure, including sequentially arranged P-type, intrinsic, and N-type diamond layers arranged between a metal-containing first and second contacts.

FIG. 10 is a side cross-sectional schematic view of a diamond diode-based detector device 190 according to certain embodiments of the present disclosure, including sequentially arranged P-type, intrinsic, and N-type diamond layers 192, 194, 196 arranged between metal-containing first and second contacts 198, 200 (which may embody ohmic contacts), and being devoid of an boron-containing conversion layer. In certain embodiments, the p-type diamond layer 192, the intrinsic diamond layer 194, and the n-type diamond layer 196 may each comprise single crystal (e.g., (111), (100), or other orientation) diamond material. In other embodiments, the p-type diamond layer 192, the intrinsic diamond layer 194, and the n-type diamond layer 196 may each comprise polycrystalline diamond material. FIG. 10 also schematically shows the effect of absorption of a proton or alpha particle by the intrinsic diamond layer 194, which leads to neutron reaction byproducts (such as Li, illustrated as "X") and alpha particles (illustrated as a), and interaction of such byproducts with the intrinsic diamond layer 194 leads to excitation of electron-hole pairs ($h^+$ and $e^-$) that results in an electric current. Leads 202 may be provided to couple the first and second contact 198, 200 with an external circuit (not shown).

In certain embodiments, a radioisotope source may be combined with one or more diamond diode-based devices to form a radioisotope generator or energy harvesting device. The structure and working principle of a diamond diode-based solid-state radioisotope generator is similar to that of the diamond diode and diamond diode detector devices described herein. In certain embodiments, CVD grown intrinsic diamond may be arranged between n-type and p-type diamond in a p-i-n diode structure. Alternatively, CVD grown intrinsic diamond (or low-doped p-type diamond) may be arranged between p-type diamond and a Schottky contact in a Schottky diode structure. In either instance, a radioisotope source (e.g., a radioactive isotope foil) is arranged proximate to the diamond diode device. Energetic particles absorbed in the intrinsic layer (possibly substituted with a low-doped p-type layer) excite electron-hole pairs, which are split by the internal electric field. This results in a current which can be directed to a load. The energetic particle source may be a radioactive isotope such as tritium, Pm-147, Ni-63, Sr-90, Pu-238, Te-99, Cm-244, Sr-90, C-14, or nuclear waste material. In certain embodiment, carbon-14 may be arranged internal to the diamond diode structure. To increase the conversion efficiency of a radioisotope generator or energy harvesting device and minimize the need for shielding, a diamond diode structure as disclosed herein may be repeated on two opposing surfaces of a radioisotope source. In certain embodiments, multiple diamond diode structures as disclosed herein (optionally provided in one or more physically interconnected array-type devices) may be arranged in parallel along one or multiple surfaces of a radioisotope source.

Figure 11:
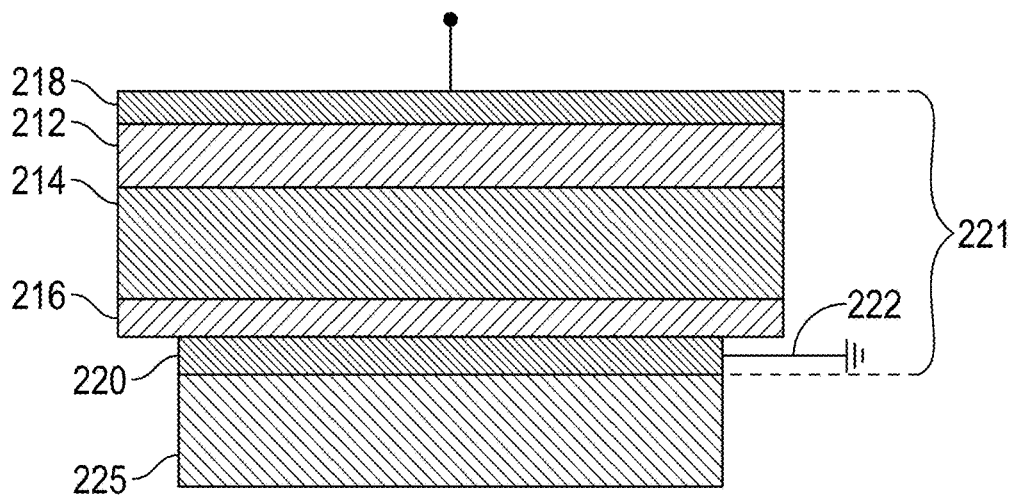
FIG. 11 is a side cross-sectional schematic view of a diamond diode-based energy harvesting device according to certain embodiments of the present disclosure, including a single P-I-N stack arranged proximate to a radioisotope source.

FIG. 11 is a side cross-sectional schematic view of a diamond diode-based energy harvesting device 210 according to certain embodiments of the present disclosure, including a single p-i-n stack 221 arranged proximate to a radioisotope source 225. The p-i-n stack 221 includes a p-type layer 212, an intrinsic diamond layer 214, and an n-type layer 216, with such layers being arranged between first and second contacts 218, 220. Leads 222 may be provided to couple the first and second contact 218, 220 with an external circuit (not shown). As illustrated, the radioisotope source 225 may be arranged proximate to the second contact 220 that is closest to the n-type layer 216; however, in certain embodiments, the radioisotope source 225 may be arranged proximate to the first contact 218 that is closest to the p-type layer 212 of the p-i-n stack 221. During operation, radioactive decay products (e.g., energetic particles) of the radioisotope source 225 are received by the intrinsic diamond layer 214, where they excite electron-hole pairs that are split by the internal electric field of the p-i-n stack 221, thereby resulting in a current that can be directed to a load by the first and second contacts 218, 220 and the leads 222.

In certain embodiments, multiple diamond diode structures may be provided proximate to a radioisotope source. One such arrangement may include first and second diamond diode structures arranged on opposing surfaces of a radioisotope source (with such source optionally configured as a radioisotope foil).

Figure 12:
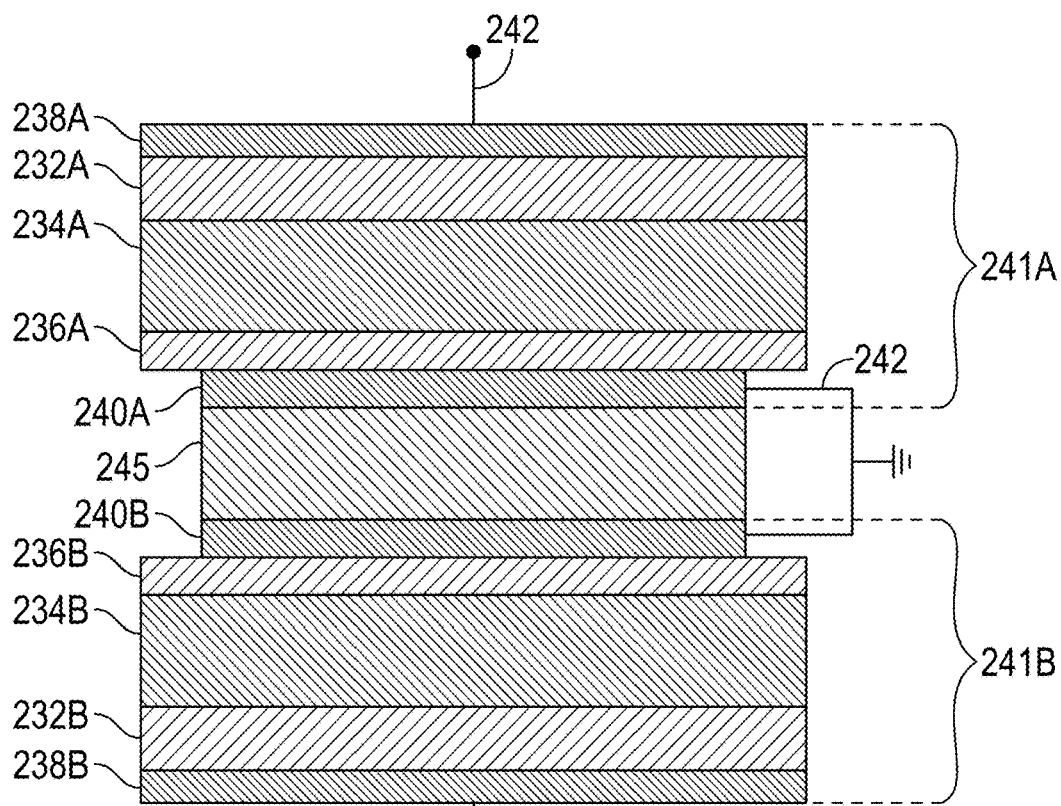
FIG. 12 is a side cross-sectional schematic view of a diamond diode-based energy harvesting device according to certain embodiments of the present disclosure, including a radioisotope source arranged between first and second P-I-N stacks.

FIG. 12 is a side cross-sectional schematic view of a diamond diode-based energy harvesting device 230 according to certain embodiments of the present disclosure, including a radioisotope source 245 arranged between first and second p-i-n stacks 241A, 241B. Each p-i-n stack 241A, 241B includes a p-type layer 232A, 232B, an intrinsic diamond layer 234A, 234B, and an n-type layer 236A, 236B, with such layers being arranged between a first contact 238A, 238B and a second contact 240A, 240B. For each p-i-n stack 241A, 241B, leads 242 may be provided to couple the contacts 238A, 240A, 238B, 240B with at least one external circuit (not shown) including an electrical load. In certain embodiments, the p-type diamond layers 232A, 232B, the intrinsic diamond layers 234A, 234B, and the n-type diamond layers 236A, 236B each comprise single crystal (e.g., (111), (100), or other orientation) diamond, with the p-type diamond layers 232A, 232B incorporating a p-type dopant (e.g., boron), and with the n-type diamond layers 236A, 236B incorporating a n-type dopant (e.g., phosphorus or nitrogen). In other embodiments, the p-type diamond layers 232A, 232B, the intrinsic diamond layers 234A, 234B, and the n-type diamond layers 236A, 236B may comprise polycrystalline diamond.

As illustrated, the radioisotope source 245 may be arranged proximate to the contacts 240A, 240B that are closest to the n-type layer 236A, 236B of each p-i-n stack 241A, 241B; however, in certain embodiments, the arrangement of each p-i-n stack 241A, 241B may be flipped such that the radioisotope source 245 may be arranged proximate to the contacts 238A, 238B that are closest to the p-type layer 232A, 232B of each p-i-n stack 241A, 241B.

In certain embodiments, a diamond diode-based energy harvesting device may include a Schottky contact, which may be provided in a Schottky/p-i-n diode or a Schottky diode. In certain embodiments, multiple diamond diodes each including a Schottky contact may be arranged proximate to a single radioisotope source.

Figure 13:
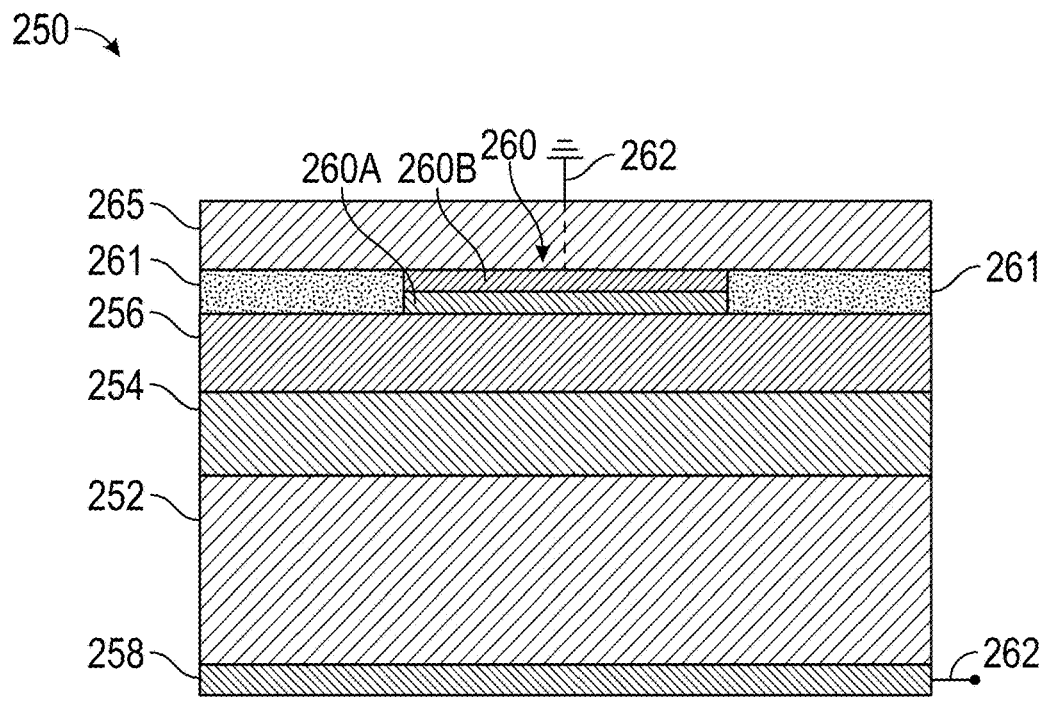
FIG. 13 is a side cross-sectional schematic view of a diamond diode-based energy harvesting device according to certain embodiments of the present disclosure, including a sequentially arranged P-type, intrinsic, and N-type diamond layers arranged between an ohmic contact and a Schottky contact, with a radioisotope source arranged proximate to the Schottky contact.

FIG. 13 is a side cross-sectional schematic view of a diamond diode-based energy harvesting device 250 according to one embodiment, including a radioisotope source 265 arranged proximate to a Schottky contact 260 of a diamond Schottky/p-i-n diode that includes an ohmic contact 258, a p-type diamond layer 252, an intrinsic diamond layer 254, and an n-type layer 256. The Schottky contact 260 may include a thin barrier metal layer 260A proximate to the n-type diamond layer 256, and an electrical contact metal layer 260B overlying the barrier metal layer 260A. In such an embodiment, the barrier metal layer 260A should be sufficiently thin enough to enable passage of radioactive decay products of interest. As shown, the Schottky contact 260 may be further arranged (laterally) between insulating material regions 261 that overlie the n-type diamond layer 256. Leads 262 may be provided to couple the contacts 258, 260 with at least one external circuit (not shown) including an electrical load. In certain embodiments, the p-type diamond layer 252, the intrinsic diamond layer 254, and the n-type diamond layer 256 each comprise single crystal (e.g., (111), (100), or other orientation) diamond, with the p-type diamond layer 252 incorporating a p-type dopant (e.g., boron), and with the n-type diamond layer 256 incorporating a n-type dopant (e.g., phosphorus or nitrogen). In other embodiments, the p-type diamond layer 252, the intrinsic diamond layer 254, and the n-type diamond layer 256 may comprise polycrystalline diamond.

In certain embodiments, an energy harvesting device similar to the diamond diode-based energy harvesting device 250 of FIG. 13 may omit the n-type diamond layer 256, with a Schottky contact 260 arranged proximate to the intrinsic diamond layer 254. In such a device, the intrinsic diamond layer 254 may optionally be low-doped with a p-type dopant at a dopant concentration much lower than the p-type layer 252, with the p-type layer 252 being a $p^{++}$ layer and the adjacent layer 254 being a $p^{--}$ layer.

As noted previously herein, one limitation of diamond diode detectors relates to the polarization effect in diamond semiconductors. The polarization effect causes a degradation of charge collection efficiency with time. To address this issue, in certain embodiments a diamond diode may be periodically pulsed with a forward bias to neutralize (e.g., remove) the polarization buildup. Such forward bias pulse may be applied to a diamond diode device configured to operate with a non-forward bias (e.g., a reverse bias or zero bias). By periodically applying a forward bias to a diamond diode, charge that has been trapped in the diamond is quickly swept away, effectively restoring field strength and resetting the diamond. Pulse frequency may be chosen for the end use application. For cases in which polarization occurs rapidly due to a higher flux, the forward bias frequency can be increased. The pulse frequency should be much less than the time constant of the polarization.

In certain embodiments, a diamond diode-based detector may be designed to operate in pulse mode for initial detection rates up to 100 kHz. Operations at much higher neutron flux (about $10^{12}$ n cm$^{-2}$ s$^{-1}$) can be achieved in pulse mode by using a very thin converter layer (about 50 nm), an suitably sized active detection area (e.g., 0.5 mm by 0.5 mm in one embodiment) and by optimizing the read-out electronics to handle detection rates up to 100 MHz. Current mode operation is limited only by the radiation hardness of a diamond diode device, a property that makes diamond the best choice among semiconductor diode detectors.

Figure 14:
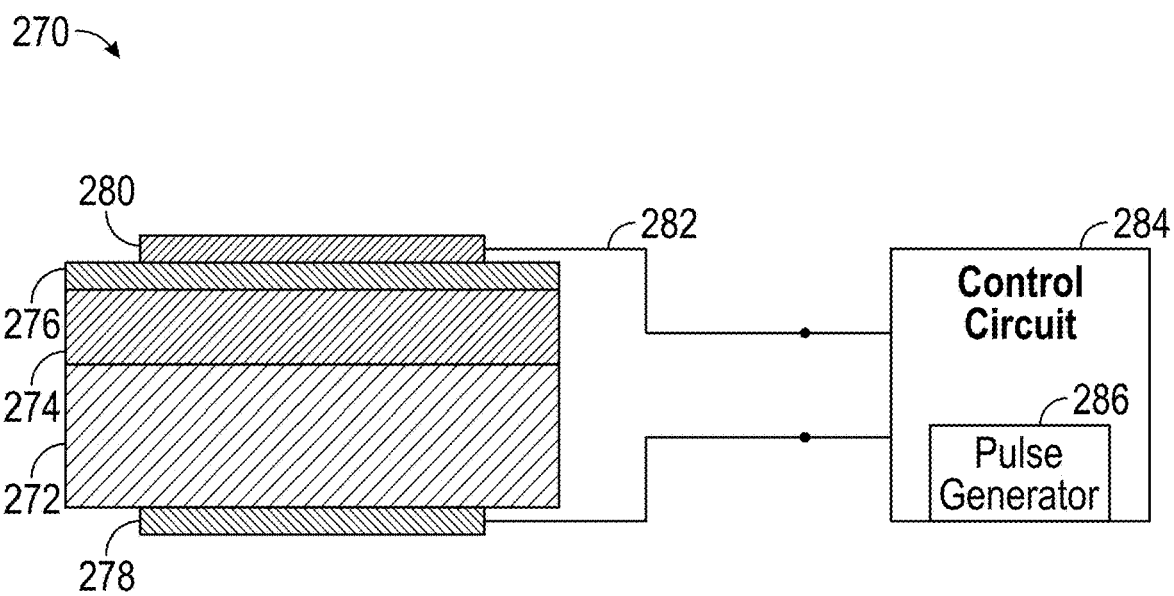
FIG. 14 is a schematic view of a diamond diode-based detector device according to certain embodiments of the present disclosure coupled with a control circuit that includes a pulse generator.

FIG. 14 is a schematic view of a diamond diode-based detector device 270 according to certain embodiments of the present disclosure coupled with a control circuit 284 that includes a pulse generator 286. Although any diamond diode-based device disclosed herein may be used; the diamond diode-based detector device 270 illustrated in FIG. 14 includes a p-type diamond layer 272, an intrinsic diamond layer 274, and a n-type diamond layer 276 that are arranged between first and second contacts 278, 280. Such contacts 278, 280 are coupled by leads 282 to the control circuit 284. As will be recognized by one skilled in the art, the control circuit 284 may include any suitable pulse generator 286 as well as components for receiving and/or processing signals from the diamond diode-based detector device 270. In certain embodiments, the control circuit 284 may include one or more transistors and/or integrated circuits (e.g., microprocessors). Further details regarding a control circuit according to one implementation are described hereinafter in connection with FIG. 17. Example 1—Diamond Diode Fabrication and Electrical Characterization A diamond-based diode detector was fabricated with a 4.5 μm thick intrinsic diamond layer arranged between p-type diamond and n-type diamond layers, with the layers arranged between first and second metal contacts. The diamond diode detector conformed to the appearance of the device 270 shown in FIG. 14, with contacts 278, 280 being smaller in area than the p-i-n layers 272, 274, 276.

The p-i-n detector diode 270 was prepared using 3 mm×3 mm×0.3 mm high-pressure, high-temperature (HPHT), boron doped p-type substrate 272 having a boron concentration of ~$1.2 \times 10^{20}$ cm$^{-3}$. With a crystallographic (111) orientation and minimum miscut angle of ±1.5 degrees, the surface was polished to an Ra of ~40 nm. Prior to intrinsic diamond layer deposition, the substrate 272 was cleaned using a three step wet-chemical process with a boil in $H_2SO_4/H_2O_2H_2O$, 3:1:1 at 220° C. for 15 min, HF treatment for 5 min, and a final boil in $NH_4OH/H_2O_2H_2O$, 1:1:5 at 75° C. for 15 min. After each step, the substrate 272 was rinsed with deionized (DI) water, and finally dried with nitrogen before transfer into the CVD reactor for growth of intrinsic diamond (to form layer 274 shown in FIG. 14). The intrinsic diamond CVD system was dedicated to growth of undoped diamond. The chamber base pressure in the low $10^{-8}$ Torr regime was achieved with oil free pumping, and the diamond deposition process employed an oil free positive displacement pump. The intrinsic diamond layer growth used research grade hydrogen, methane and 6N oxygen. A dual-wavelength (2.1/2.4 μm) optical pyrometer was employed for temperature control and film thickness measurement. Heating of the substrate was achieved through exposure to the plasma discharge taking advantage of plasma focusing and a water cooled sample stage.

Prior to intrinsic diamond growth, the diamond substrate 272 was exposed to a pure hydrogen plasma at a temperature of ~800° C. for 5 min. The intrinsic diamond layer 274 was grown using 392 sccm hydrogen, 7 sccm methane and 0.75 sccm oxygen at a chamber pressure of 65 Torr and a microwave power of 1200 W establishing a growth temperature of 800-850° C. Under these growth conditions, the main impurity is nitrogen with a concentration of ~$7 \times 10^{15}$ cm$^{-3}$. For the successive, n-type phosphorus doped diamond layer, the sample was loaded into a dedicated phosphorus doping CVD system operating with oil free pumping similar to the intrinsic system and using a mixture of 200 ppm trimethylphosphine (TMP) in hydrogen gas as the dopant source. After an initial surface cleaning step by exposure of the intrinsic layer 274 to a pure hydrogen plasma, the phosphorus doped n-type layer 276 was grown with flow rates for hydrogen, TMP-hydrogen, and methane of 350 sccm, 50 sccm and 0.5 sccm, respectively. At a chamber pressure of 60 Torr and microwave power of 2000 W, a temperature of about 900° C. was measured. From similarly grown films, a thickness of about 400 nm and a phosphorus concentration of ~$5 \times 10^{19}$ cm$^{-3}$ was derived from SIMS results.

A first step in formation of contacts on diamond of the diode device involved terminating the surface with oxygen (O). This was done to avoid surface conduction resulting from the formation of a two-dimensional hole gas once the sample is exposed to air post hydrogen plasma in the diamond growth reactor. The procedure used has been described in M. Dutta, et al., IEEE Electron Device Letters 38 (5) (2017) 600-603. Prior to contact deposition, an O-plasma ash step was performed using a Tegal Oxygen asher at 200 W power and 400 mTorr pressure to ensure a pristine surface for the metal deposition. The metal contacts 278, 280 were deposited using a Lesker PVD75 e-beam metal deposition system. A shadow mask was used to prevent metal deposition along the side walls of the sample. Each contact 278, 280 included a metal stack consisting of Ti/Pt/Au having thicknesses of 50 nm/50 nm/150 nm. Ti was used for better adhesion, and Au was used to prevent oxidation of Ti and Pt as a barrier to prevent formation of a high resistance Ti—Au intermetallic. The diamond diode-based detector 270 used the same contact metallization on a commercially obtained, electronic grade, (100) single crystal diamond type IIa plate having dimensions of 3 mm×3 mm. A partial mesa etch was used to restrict the perimeter of the n-type layer to be slightly beyond the metal contacts 278, 280, thus preventing leakage current around the device 270 during operation.

The 4.5 μm p-i-n diode was characterized first by measuring the p-i-n current-voltage (I-V) curve. This was followed by a measurement of the charge collection efficiency using the 5.3 MeV α-particle radiation coming from the $^{210}$Po radioactive source.

Figure 15:
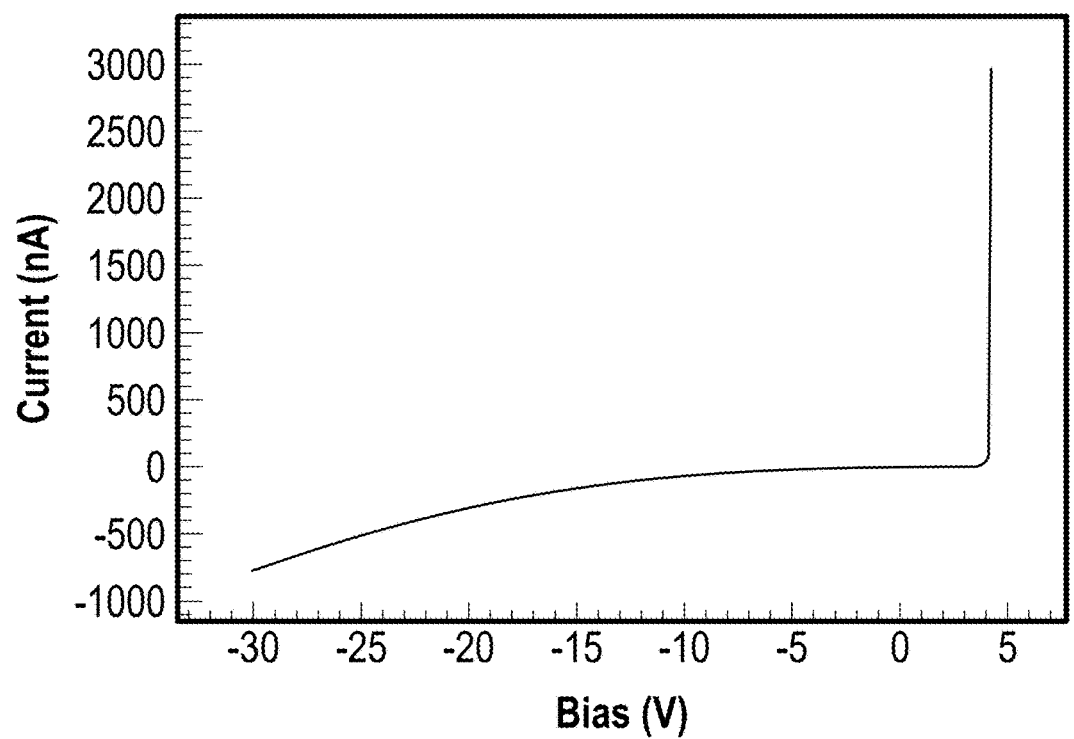
FIG. 15 is a plot of current versus bias for a diamond diode-based detector device including sequentially arranged P-type, intrinsic, and N-type diamond layers arranged between ohmic contacts, with the device including a turn-on voltage of ~4.5 to 5V.

The IV curve was found by placing a potential difference on the p-i-n diamond and measuring the current. The diamond diode was biased using an ORTEC 428 detector bias supply. The current was measured with an adjustable transimpedance amplifier (TIA) made with Linear Technologies operational amplifiers. The TIA voltage output is converted to a current using the known transimpedance of the amplifier, which is configurable with sensitivities ranging between 1 V/μA and 1 V/nA. The resulting I-V response is shown in FIG. 15. The response curve indicates that the diamond behaved electrically as a diode and had a turn-on voltage of ~4.5 to 5V.

For the measurement of the thickness of the intrinsic layer, the capacitance was measured as a function of the DC bias on the p-type layer using a 30 mV rms AC signal at 30 kHz. The DC bias on the substrate was swept from +6 V to −30 V. The measurement was performed with a Keithley 4200 SCS Parameter Analyzer. Assuming a relative permittivity of 5.7 and an active area of 3 mm×3 mm, the thickness of the intrinsic-layer was calculated to be at least 4.46 µm using the value of normalized capacitance at −30V. The Vbi was found to be ~4.5-5 V, which is similar to the observed turn on voltage in the I-V response.

Figure 16:
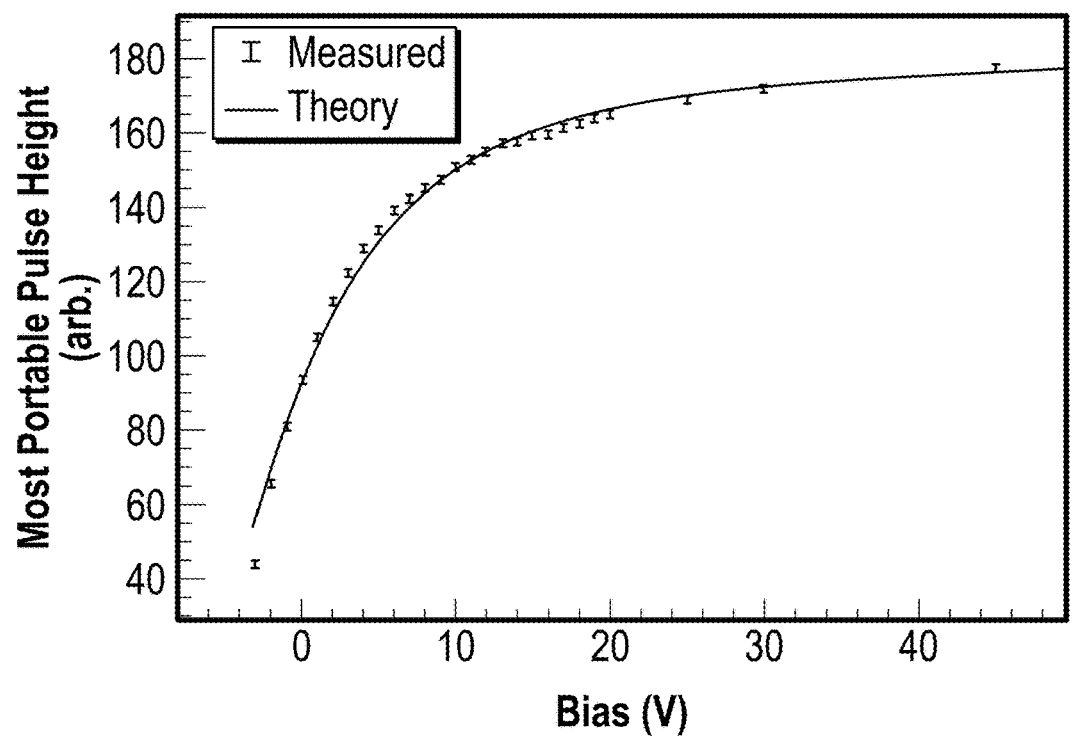
FIG. 16 is a plot of pulse height values for α-particle radiation from $^{210}$Po as a function of the voltage applied to a 4.5-μm p-i-n diamond diode, with the measured points are compared with a simulation.

To measure the charge collection efficiency, the 4.5 µm diamond diode was connected to a standard pulse counting electronics system. The signal connection was fed into an ORTEC 142A preamplifier and the output connected to an ORTEC 672 spectroscopy amplifier. The n-side of the diamond diode was biased between −3 V and 45 V relative to the p-side (reverse bias is positive) using the ORTEC 428 detector bias supply. The p-side was biased to ground, and the response to the α-radiation from the $^{210}$Po source was also measured from the n-side. Pulse height distributions were collected for the above biases and the most probable value for each distribution, corresponding to the most probable energy deposit or energy peak, was selected and plotted versus the bias. The results are shown in FIG. 16, which is a plot of pulse height values for α-particle radiation from $^{210}$Po as a function of the voltage applied to a 4.5 µm p-i-n diamond diode, with the measured points are compared with a simulation. The experimentally observed charge collection efficiency curve can be accurately reproduced by modeling the p-i-n diamond detector using Silvaco ATLAS (a commercial semiconductor device simulator) modified for diamond materials. The alpha particle induced electron-hole generation rate as a function of width in diamond was obtained using the TRIM (Transport of Ions in Matter) Monte Carlo simulator for high energy particles in solids. The initial rise at low voltage is well described by the Hecht equation (see K. Hecht, Z. Phys. 77 (1932)) assuming a mobility-lifetime (µτ) product for holes of $8\times10^{-8}$ cm$^2$/V in the intrinsic layer. The lack of a strong saturation at large voltages deviates from the Hecht model, and can be reproduced in ATLAS by including $10^{14}$ cm$^{-3}$ donor impurities in the intrinsic layer. The presence of the donors in the intrinsic layer results in only partial depletion of intrinsic region, which reduces the effective width of the I-region, which becomes fully depleted with increasing applied voltage as compared to an ideal intrinsic layer.

Figure 17:
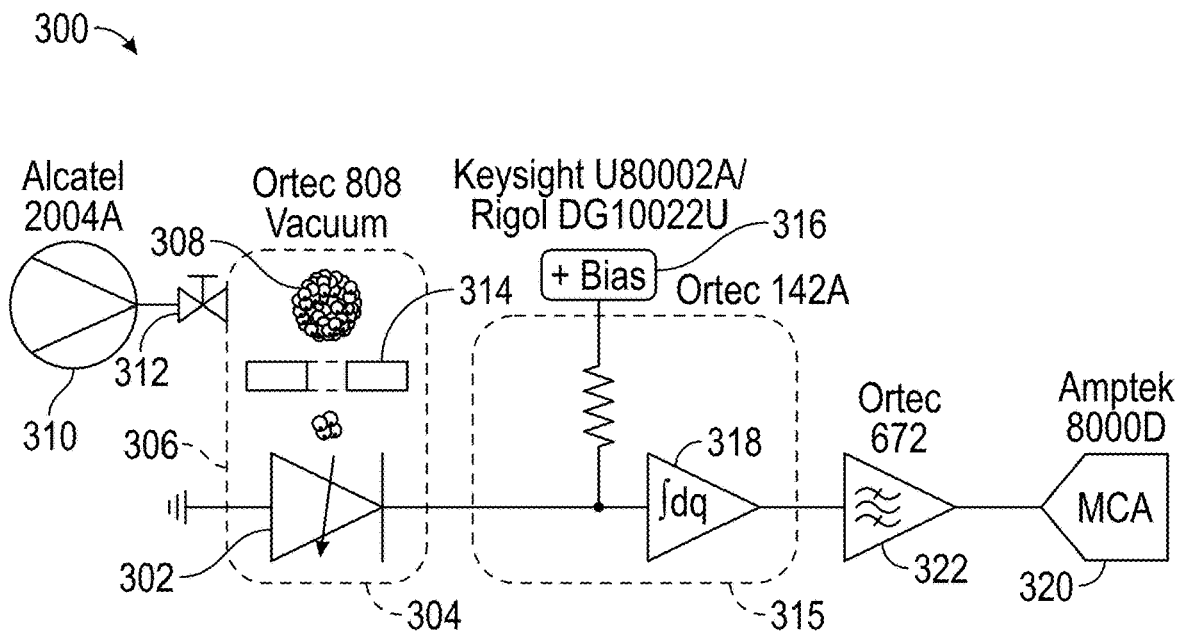
FIG. 17 is a schematic diagram showing components of a pulse-mode detector testing system utilizing a diamond diode-based detector suitable for detecting radioactive decay products.

The responses to the mono-energetic α-particle from $^{210}$Po were measured for the 4.5 µm p-i-n diode and also for a commercial, undoped, 300 µm single crystal diamond, both with the above-described pulse mode electronics. The main components of the test system 300 are illustrated in FIG. 17. The diode detector 302 and the $^{210}$Po source 308 were mounted inside a vacuum chamber 304 (i.e., ORTEC 808 vacuum chamber), in which vacuum conditions were established by an Alcatel 2004A dual stage vacuum pump 310 (with a valve 312 arranged between the vacuum chamber 304 and the vacuum pump 310). A collimator 314 (6 mm long with a 300 µm diameter aperture) was placed in front of the $^{210}$Po source 308. The operating vacuum was around 30 mTorr. The diode detector 302 was coupled to a circuit 315 including an Ortec Model 142A charge integrating preamplifier 318, a Keysight U80002A power supply 316 used to provide constant bias, and a Rigol DG1022U signal generator used to generate periodic forward bias pulses. The output was connected to an ORTEC 672 spectroscopy amplifier 322 and signals were fed into an Amptek 8000D multi-channel analyzer (MCA) 320.

The $^{210}$Po source 308 was a rectangular foil with an active area of 17.8 mm×5.1 mm, an activity of 250 µCi, and was sealed by 1.778 µm of gold metal. Because the $^{210}$Po is sealed within a gold layer, the 5.3 MeV α-particles lose some energy and gain a spread in energy due to the straggling effect. The code SRIM (Stopping and Range of Ions in Matter) (see J. F. Ziegler, et al., The Stopping and Range of Ions in Solids, Pergamon Press, New York, 1985) to model the effect of the gold foil on the alpha particles.

Figure 18:
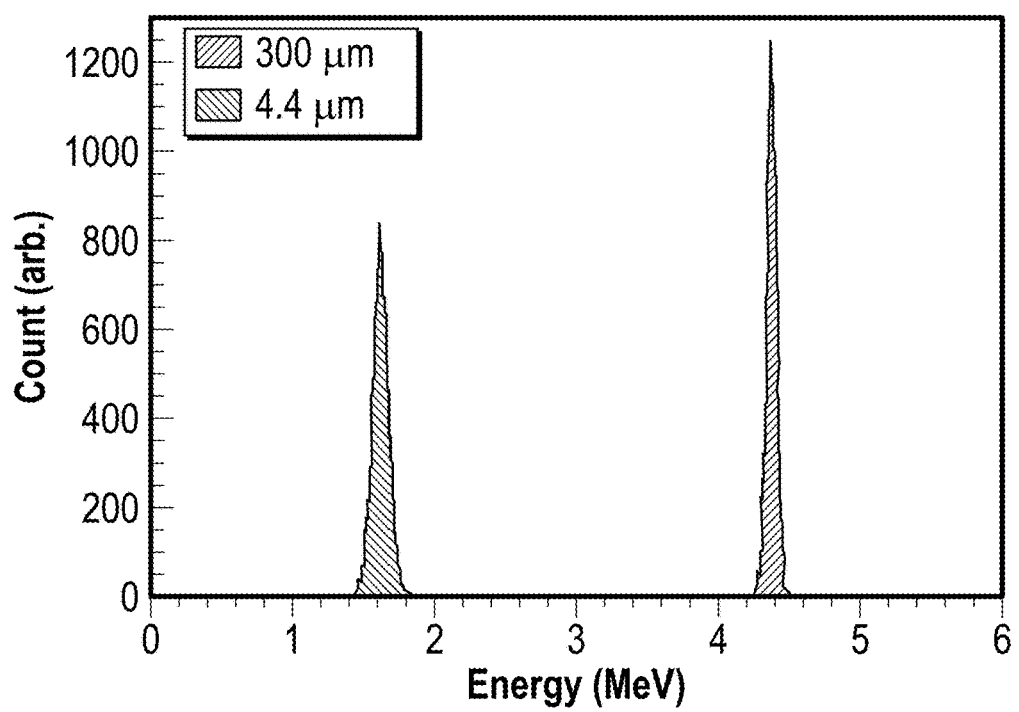
FIG. 18 is a plot of pulse height distributions for the response to 4.490±0.033 MeV α-particles emitted from a sealed $^{210}$Po radioactive source as simulated by the code SRIM, including a first histogram for a 4.5-μm p-i-n-doped diamond diode, and a second histogram for an undoped 300-μm single crystal diamond.

FIG. 18 is a plot of pulse height distributions for the response to 4.490±0.033 MeV α-particles emitted from a sealed $^{210}$Po radioactive source as simulated by the code SRIM, including a first histogram for a 4.5-µm p-i-n-doped diamond diode, and a second histogram for an undoped 300-µm single crystal diamond. Thus, FIG. 18 combines SRIM results obtained for both the doped 4.5 µm p-i-n diode and the undoped 300 µm single diamond, the latter used to capture the full energy coming from the source detected with higher resolution. The mean energy of alpha particles emitted normal to the seal plane was found to be 4.490 MeV with a standard deviation a of 30 keV or 0.7%. The 0.7% a amounts to the straggling obtained using the Bohr's formula (see N. Bohr, Mat. Fys. Medd. Dan. Vid. Selsk 18 (8) (1948)), which is known to be lower than the σ from the experimental data on MeV-range α-particle straggling though metal foils.

Figure 19:
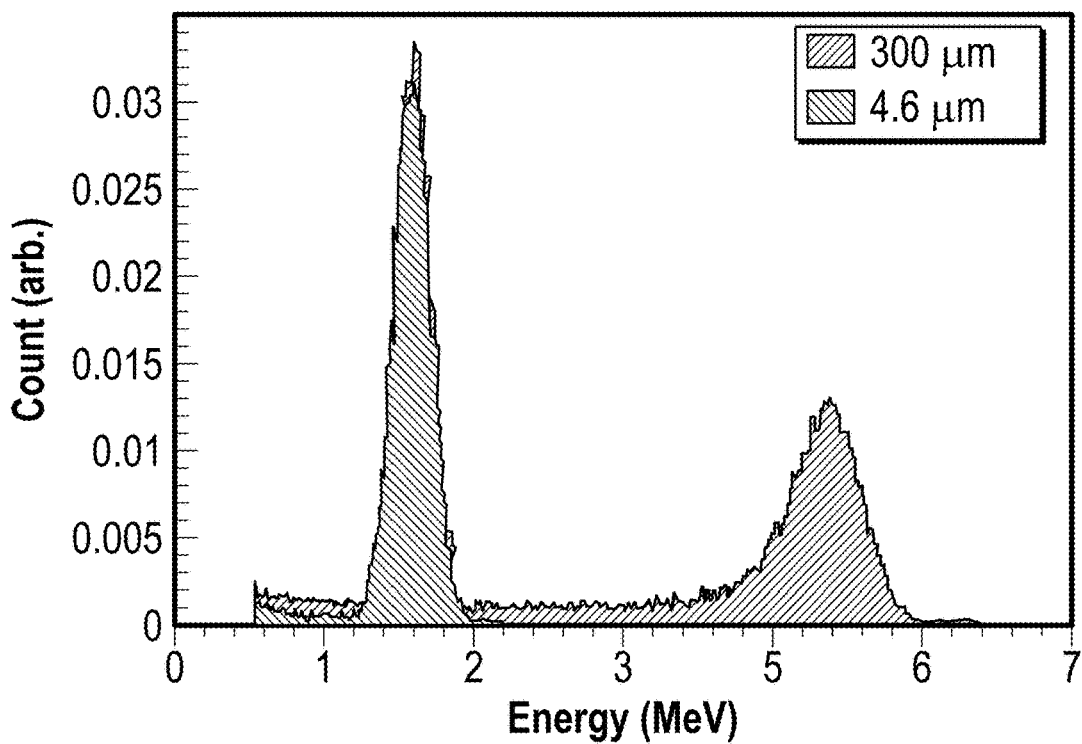
FIG. 19 is a plot of pulse height distributions for the response to 4.5±0.1 MeV α-particles emitted from a sealed $^{210}$Po radioactive source, including a first histogram for a 4.5-μm p-i-n-doped diamond diode, and a second histogram for an undoped 300-μm single crystal diamond.

The mean energy deposit in the 4.5 µm detector is about 1.6 MeV and it is shown in FIG. 18 by the left histogram. Thus, the 1.47 MeV alpha particles emitted following neutron capture from a Boron converter will stop in the 4.5 µm diamond detector. The experimental results are shown in FIG. 19, which combines the measured results of the pulse height distributions obtained for both the doped 4.5 µm p-i-n diode and the undoped 300 µm single crystal diamond plate. The alpha particles deposit all of their energy in the 300 µm single diamond as is shown by the (right peak) histogram of FIG. 19. From FIG. 19, taking the ratio of the peak values of the distributions, one obtains 2.77±0.26. This is in agreement with the SRIM calculated value from FIG. 18 for the ratio of the full energy to the energy deposit in the p-i-n diode, namely 2.75±0.10, with the latter uncertainty being a lower limit. The mean energy deposited in the p-i-n diode was approximately 1.6 MeV and its detection was achieved with almost no background and an 8% standard deviation dominated by the straggling in the source gold foil and in the 4.5 µm p-i-n diamond.

Figure 20:
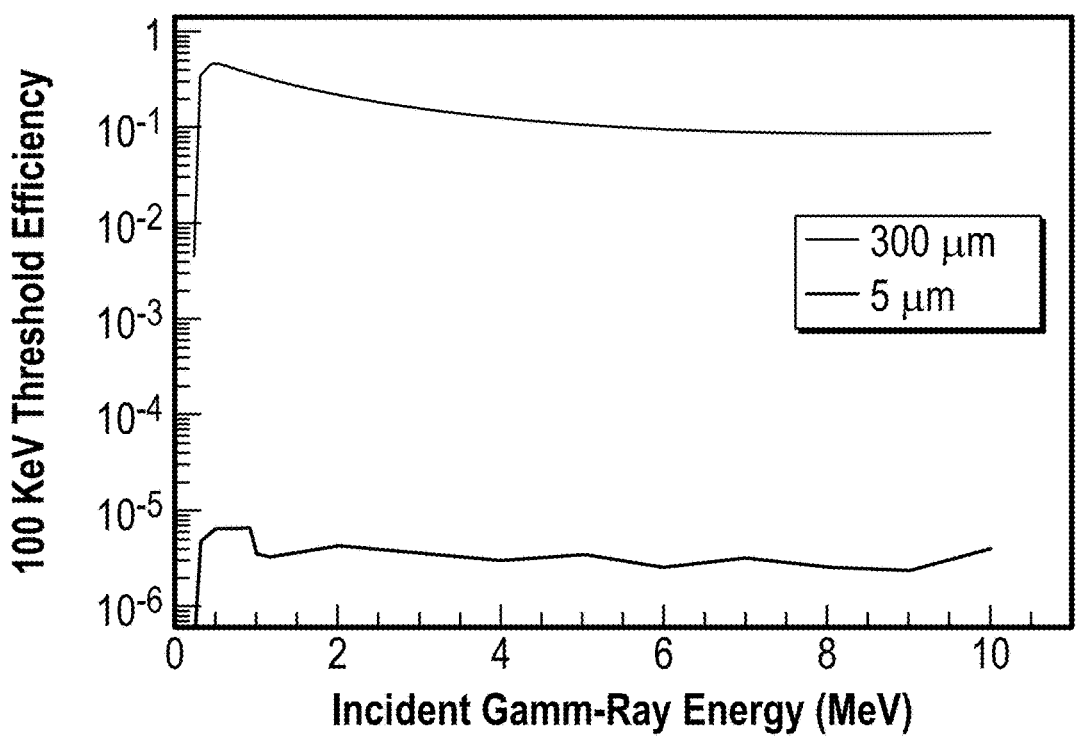
FIG. 20 is a plot of efficiency for gamma ray detection as a function of gamma ray energy for a 100 KeV threshold as calculated by the code GEANT4, including an upper curve for a 300 μm thick diamond and a lower curve for a 5 μm thick diamond.

It is to be appreciated that the p-i-n diode can be modified to deposit a layer of boron-containing material and effectively create a slow neutron detector by detecting α-particles with energies ≤1.47 MeV. Such a detector would desirably have an estimated 5% efficiency for thermal neutrons, and it would be rather insensitive to gamma radiation. Such effects are shown by FIG. 20, which is a plot of efficiency for gamma ray detection as a function of gamma ray energy for a 100 KeV threshold as calculated by the code GEANT4, including an upper curve for a 300 µm thick diamond and a lower curve for a 5 µm thick diamond. Based on the neutron kerma coefficients, it is expected that the fluence for thermal neutrons can be about five orders of magnitude higher than that for the standard 1 eV neutrons.

Example 2—Periodic Forward Biasing of Diamond Diode to Neutralize Polarization

A 250 µCi $^{210}$Po alpha source sealed with a gold foil was used for studying the polarization effect of the diamond p-i-n diode detector device of Example 1. Because the $^{210}$Po was sealed within a gold foil with thickness 1.778 μm, the 5.3 MeV alpha particles leave the source with about 4.5 MeV. The 4.5 MeV alpha particles then pass completely through the 4.5 μm intrinsic diamond layer depositing about 1.6 MeV into the intrinsic diamond layer. The alpha particle source was placed about 3.3 cm away from the detector inside a vacuum with about 50 mTorr pressure. No collimation was used in order to have a sufficient flux, however the large distance from the detector helped to reduce the acceptance of alpha particles with large angles. The detector was operated in pulse-mode using the circuit components shown in FIG. 17. In particular, a Keysight U80002A power supply was used to provide constant bias, and a Rigol DG1022U signal generator was used to provide periodic forward bias pulses. The Rigol DG1022U signal generator has a square pulse option where the period, duty cycle, and peak to peak amplitude are highly selectable. The n-side of the diamond diode 302 was biased between 0 V and 30 V relative to the p-side (reverse bias is positive). The bias is coupled to the detector through an RC network located inside the Ortec 142A, which has a time constant of about 1 second. The p-side of the diode detector 302 was biased to ground and the response to the alpha radiation from the $^{210}$Po source was also measured from the n-side.

All forward bias pulses were 10 Volts applied for 1 second. The resistor value in the RC circuit of the Ortec 142A is 10 MOhm, so applying a forward bias puts approximately 1 μA of current through the diode. The bias RC-filtration circuit places a minimum on the duration of the pulse required to forward bias the diode since pulses with a period much less than the time constant of the RC circuit are filtered out. For this reason, the bias filtering must be tuned to allow for faster forward bias pulses if required by the application.

Figure 21:
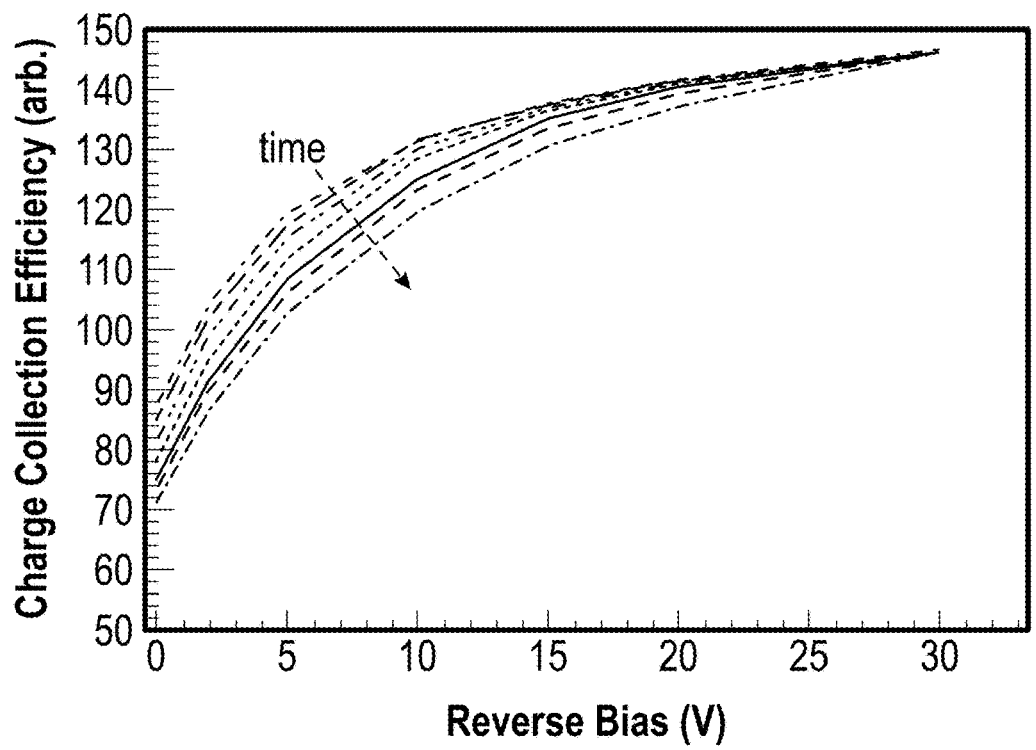
FIG. 21 is a plot of the charge collection efficiency versus reverse bias voltage at various times (i.e., 18, 300, 600, 1200, 1800, 2400, and 3588 seconds) after starting from no polarization for a diamond diode-based detector device including sequentially arranged P-type, intrinsic, and N-type diamond layers arranged between ohmic contacts.

The effect of polarization on the charge collection efficiency measured at various times after starting from an unpolarized state is demonstrated in FIG. 21. FIG. 21 is a plot of the charge collection efficiency versus reverse bias voltage at various times (i.e., 18, 300, 600, 1200, 1800, 2400, and 3588 seconds, respectively) after starting from no polarization for a diamond diode-based detector device (e.g., device 270 shown in FIG. 14). As observed, the polarization effect causes a degradation of the charge collection efficiency with time. A closer examination of FIG. 21 shows that polarization effectively reduces the bias by about 5 Volts after an hour for this diamond p-i-n detector.

Figure 22:
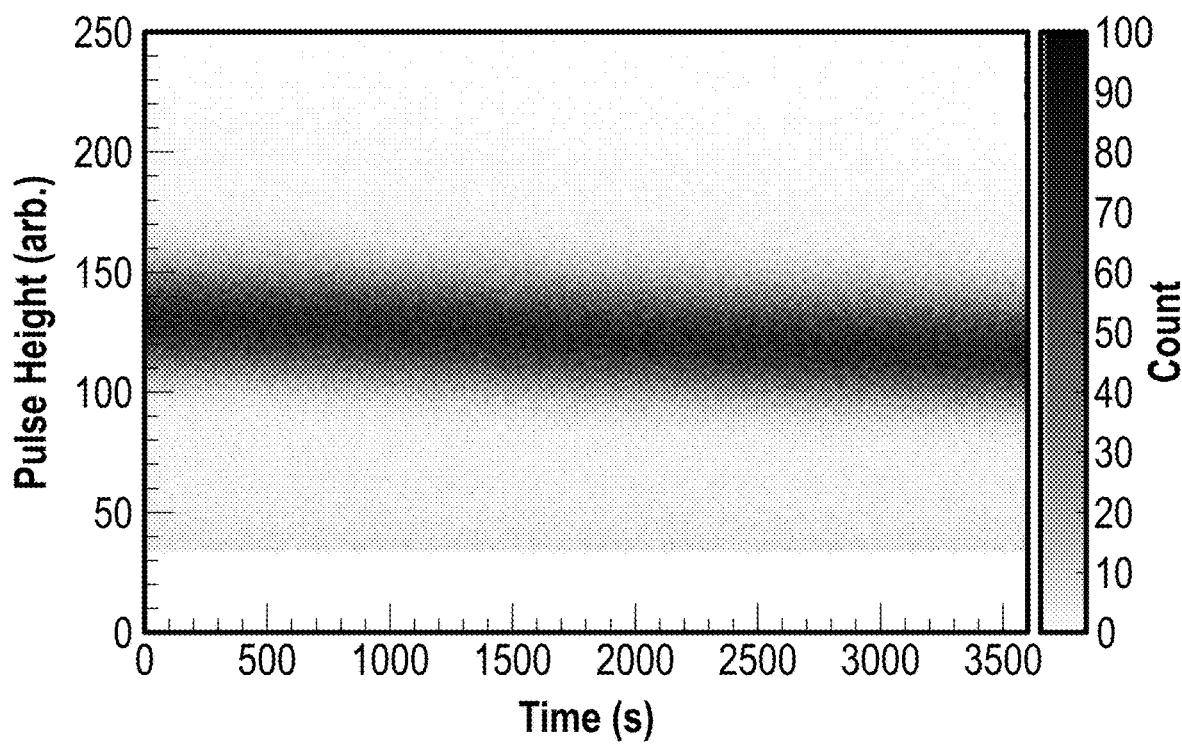
FIG. 22 is a plot of pulse height versus time for operation of a diamond diode-based detector device (including sequentially arranged P-type, intrinsic, and N-type diamond layers arranged between ohmic contacts) with the device positioned 3.3 cm from a radiation source, and without any periodic forward bias applied to the device.

FIG. 22 is a plot of pulse height versus time for operation of a diamond diode-based detector device (according to FIG. 14) with the device positioned 3.3 cm from a radiation source without an intermediately arranged collimator, and without any periodic forward bias applied to the detector device. As shown, the signal strength is reduced over time due to the polarization effect, evidenced by the pulse heights drifting lower with time. When the radiation source was closer to the detector (increasing flux), the polarization effect was observed to be more rapid.

Figure 23:
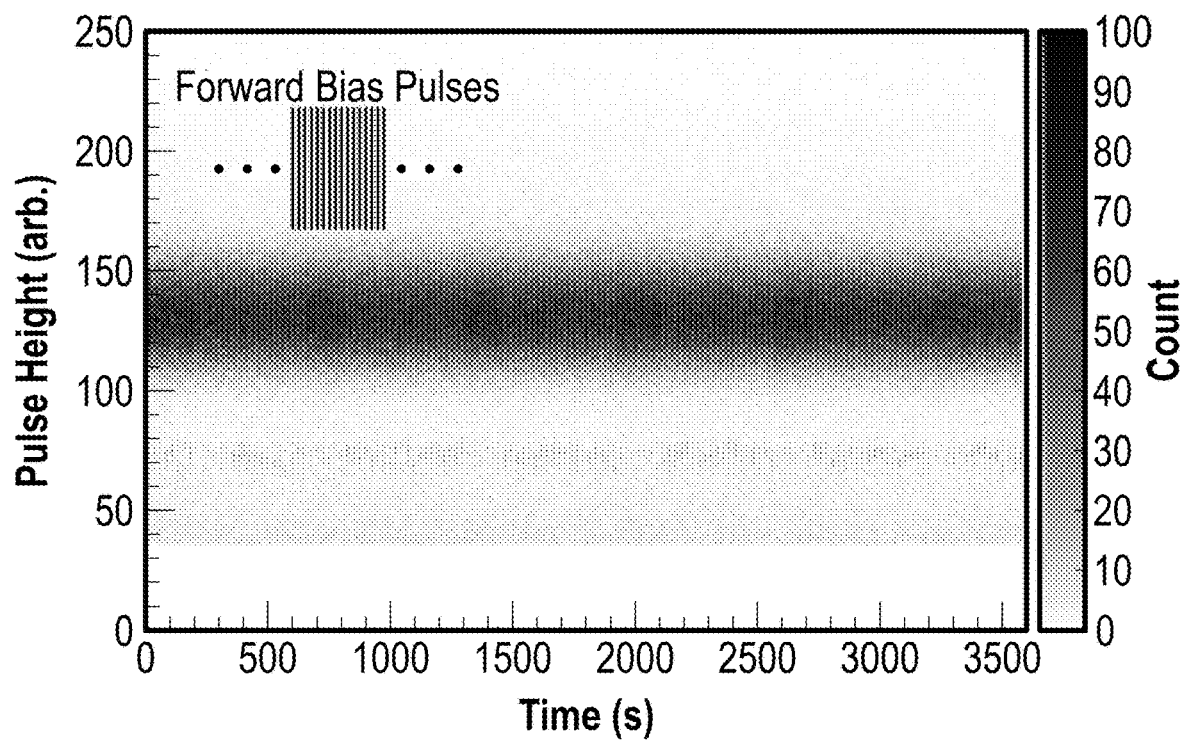
FIG. 23 is a plot of pulse height versus time for operation of a diamond diode-based detector device (including sequentially arranged P-type, intrinsic, and N-type diamond layers arranged between ohmic contacts) with the device positioned 3.3 cm from a radiation source, and with a 10V forward bias supplied to the device for 1 second out of every 24 seconds.

By introducing a forward bias for 1 second out of every 24 seconds, the polarization effect is mitigated completely as shown in FIG. 23. FIG. 23 is a plot of pulse height versus time for operation of a diamond diode-based detector device (according to FIG. 14) with the device positioned 3.3 cm from a radiation source without an intermediately arranged collimator, and with a 10V forward bias supplied to the device for 1 second out of every 24 seconds. As shown, the polarization effect is neutralized with the periodic forward bias pulse, resulting in no discernable signal strength reduction over time. For cases where polarization occurs more rapidly due to a higher flux, the forward bias frequency can be increased. To mitigate the effect of polarization, the forward bias pulsing period needs to be much less than the time constant of the polarization.

Figure 24:
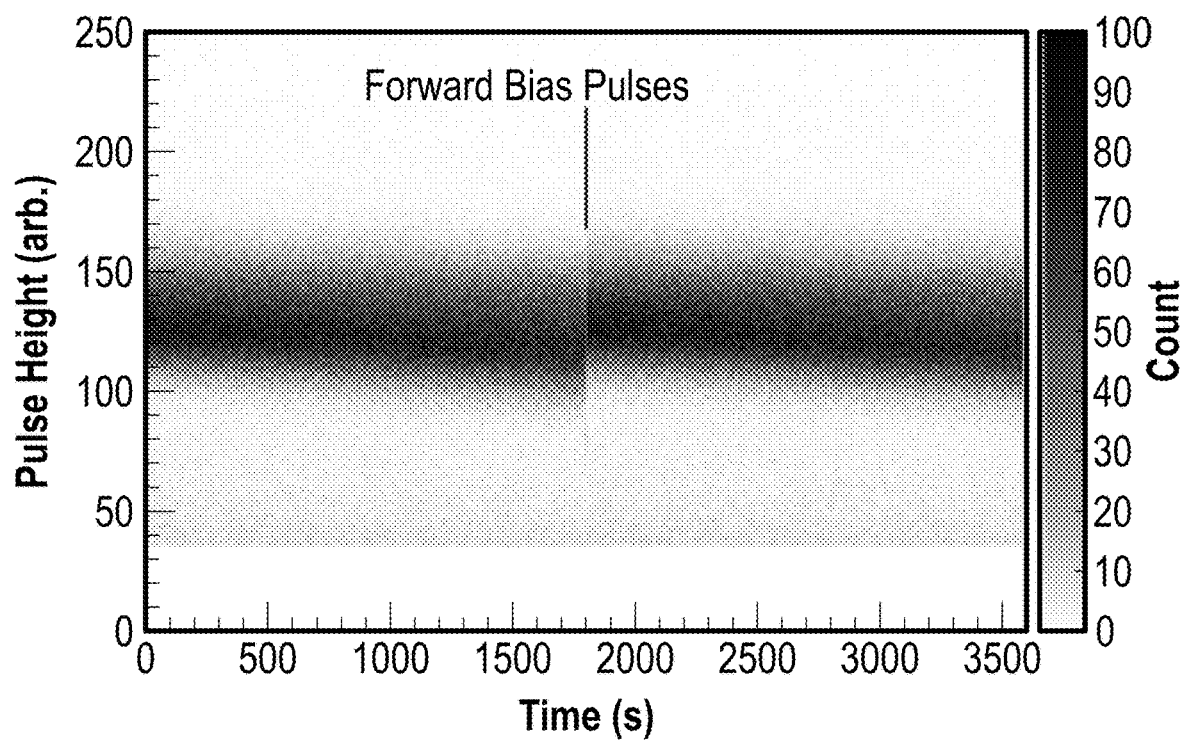
FIG. 24 is a plot of pulse height versus time for operation of a diamond diode-based detector device (including sequentially arranged P-type, intrinsic, and N-type diamond layers arranged between ohmic contacts) with the device positioned 3.3 cm from a radiation source, and with a 10V forward bias pulse supplied to the device for 1 second out of every 1800 seconds.

To demonstrate a full polarization reset from a single forward bias pulse, the period was set to once every 30 minutes. FIG. 24 is a plot of pulse height versus time for operation of a diamond diode-based detector device (according to FIG. 14) with the device positioned 3.3 cm from a radiation source, and with a 10V forward bias pulse supplied to the device for 1 second out of every 1800 seconds. FIG. 24 shows that a single forward bias pulse is enough to reset the diamond.

Figure 25:
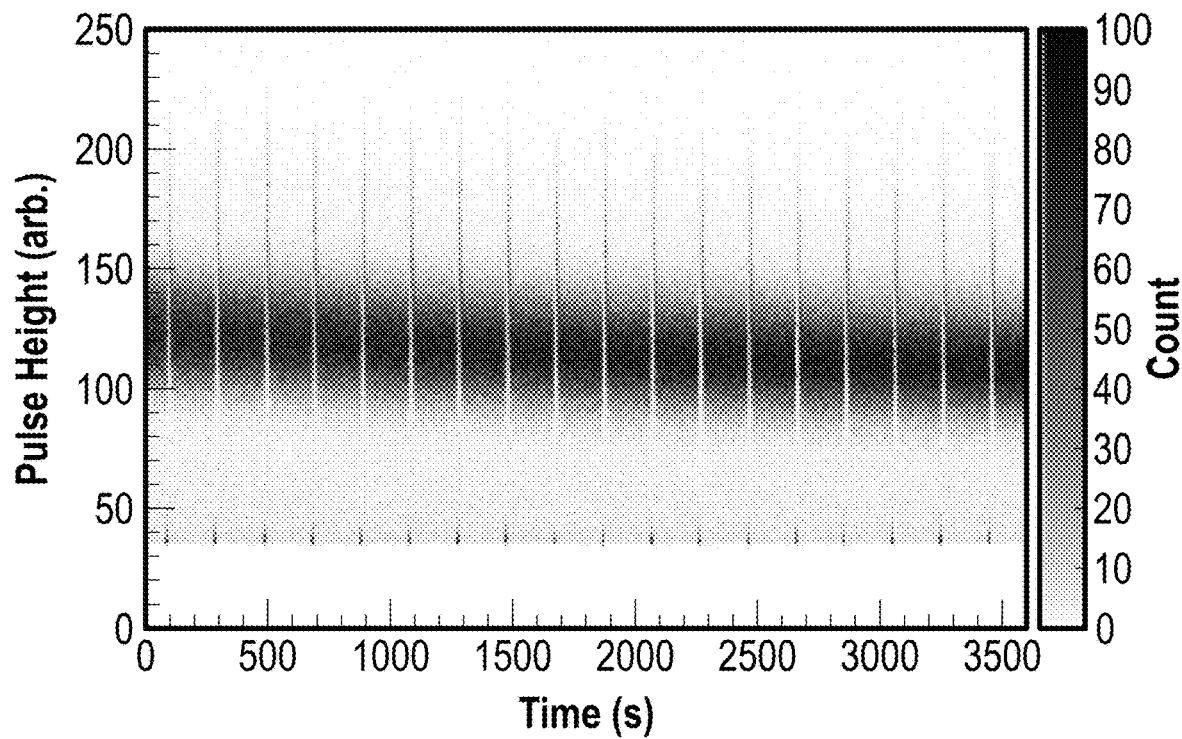
FIG. 25 is a plot of pulse height versus time for operation of a diamond diode-based detector device (including sequentially arranged P-type, intrinsic, and N-type diamond layers arranged between ohmic contacts) with the device positioned 3.3 cm from a radiation source, and with periodic radiation removal for approximately 10 seconds out of every 192 seconds.
Figure 26:
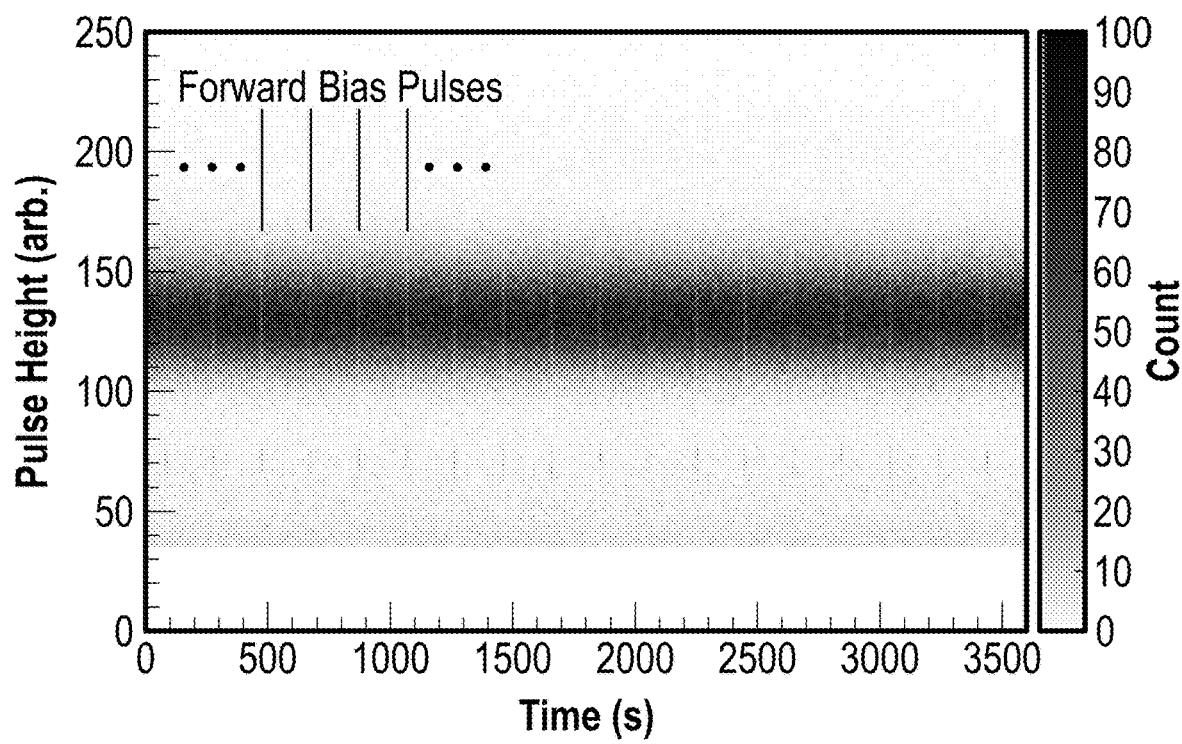
FIG. 26 is a plot of pulse height versus time for operation of a diamond diode-based detector device (including sequentially arranged P-type, intrinsic, and N-type diamond layers arranged between ohmic contacts) with the device positioned 3.3 cm from a radiation source, and with a 10V forward bias pulse supplied to the device for 1 second out of every 192 seconds.

An attempt was made to reduce the polarization effect by removing the alpha source periodically for 10 seconds out of every 192 seconds for a measurement lasting 1 hour. FIGS. 25 and 26 show a comparison between removing the alpha source periodically and supplying periodic forward bias pulses, both at the same frequency. FIG. 25 is a plot of pulse height versus time for operation of a diamond diode-based detector device (according to FIG. 14) with the device positioned 3.3 cm from a radiation source, and with periodic radiation removal for approximately 10 seconds out of every 192 seconds. FIG. 26 is a plot of pulse height versus time for operation of a diamond diode-based detector device (according to FIG. 14) with the device positioned 3.3 cm from a radiation source, and with a 10V forward bias pulse supplied to the device for 1 second out of every 192 seconds. Unlike the forward bias result shown in FIG. 26, no noticeable reduction of the polarization effect was seen by removing the radiation with periodic radiation removal as shown in FIG. 25. Periodic forward biasing has therefore been shown to be beneficial to effectively restore field strength and reset a diamond detector, to neutralize (e.g., remove) the polarization buildup in a diamond diode device.

Embodiments disclosed herein may provide one or more of the following beneficial technical effects. Diamond diode structures disclosed herein have a larger effective depletion region than PN junctions, which allows for a larger active region and results in a higher efficiency for converting incident energetic particles into current, for detection or energy generation purposes. Pulse mode diamond-based diode detectors may be used to measure fast radiation emission rates. In detector mode, diamond diode structures disclosed herein can operate at lower voltages (<20 V) compared to PN or metal-diamond plate devices, resulting in less arcing of the electrical connections, less noise, and more robust devices. Diamond diode structures disclosed herein create an internal electric field, which will separate the generated electron-hole pairs and cause them to move in opposite directions, resulting in a net current which can be measured or utilized by an external circuit. Because this electric field is generated by the diamond diode (e.g., p-i-n, p-i-n/Schottky diode or Schottky diode) structure, detectors can operate with zero external voltage. Single crystal [(111), (100) and other orientations] and/or polycrystalline diamond can be used in certain embodiments. Diamond structures have demonstrated charge collection length (for both electrons and holes) that exceeds 200 μm (the sample thickness) at an applied field of less than 0.5 V/um. The wide band gap of intrinsic diamond enables near zero dark current at room temperature, and thus, the dark current in diamond p-i-n diodes is zero. By varying the intrinsic region thickness, the breakdown voltage of the device can be tuned. In addition, the material properties of intrinsic diamond make it the ideal material to withstand tens, hundreds, or thousand volts and efficiently conduct both electron or hole currents. A large bandgap, which suppresses thermal noise, enabling a large dynamic range. Diamond is stable at high temperatures (700° C.) and radiation flux (~50% signal degradation for $10^{15}$ n/cm$^2$ fluence), resulting in meaningful improvements in precision and calibration. Diamond diode detector devices disclosed herein can be used at high temperature without the use of cooling systems, where the thermal conductivity of diamond itself acts as heat dissipating source. Diamond p-i-n detectors can rapidly reset their properties by a short current pulse in the forward bias direction. This pulse restores the high sensitivity of the initial state presumably by removing charges that accumulate at defect sites. Thin diamond intrinsic layer makes it insensitive to gamma radiation, enabling a more accurate determination of neutron flux. High electron and hole mobility offers efficient and fast detection. Compact design, stability and efficiency of diamond detectors make them accessible as real time pulse mode radiation detectors, suitable pulse mode neutron/proton/alpha detection.

Upon reading the foregoing description in light of the accompanying drawings, those skilled in the art will understand the concepts of the disclosure and will recognize applications of these concepts not particularly addressed herein. Those skilled in the art will recognize improvements and modifications to the preferred embodiments of the present disclosure. All such improvements and modifications are considered within the scope of the concepts disclosed herein and the claims that follow.

What is claimed is:

1. A diode-based detector device comprising:
a p-type diamond layer;
a n-type diamond layer; and
an intrinsic diamond layer arranged between the p-type diamond layer and the n-type diamond layer; and
a circuit configured to transmit a current pulse in a forward bias direction of the diode-based detector device to reset a detection state of the diode-based detector device, wherein during detector operation, the diode-based detector device is configured to be operated in a non-forward-biased state;
wherein the diode-based detector device further comprises at least one of the following features (i) or (ii):
(i) a boron-containing layer is arranged proximate to at least one of the n-type diamond layer or the intrinsic diamond layer, wherein the boron-containing layer comprises one or more of boron nitride, boron carbide, boron oxide, boron, another boron compound, or a conducting metal boride; or
(ii) the intrinsic diamond layer comprises a thickness in a range of from 10 nm to 300 microns.

2. The diode-based detector device of claim 1, comprising feature (i).

3. The diode-based detector device of claim 2, further comprising a first metal-containing contact adjacent to the n-type diamond layer, and a second metal-containing contact adjacent to the p-type diamond layer, wherein the first metal-containing contact is arranged between the n-type diamond layer and the boron-containing layer.

4. The diode-based detector device of claim 2, wherein the boron-containing layer comprises a conducting boron-containing layer, and the n-type diamond layer is arranged between the conducting boron-containing layer and the intrinsic diamond layer.

5. The diode-based detector device of claim 4, wherein the conducting boron-containing layer serves as a first contact, and the diode-based detector device further comprises a metal-containing contact adjacent to the p-type diamond layer.

6. The diode-based detector device of claim 2, wherein:
the intrinsic diamond layer includes a first intrinsic diamond sublayer and a second intrinsic diamond sublayer; and
the boron-containing layer is arranged between the first intrinsic diamond sublayer and the second intrinsic diamond sublayer.

7. The diode-based detector device of claim 6, wherein:
each of the p-type diamond layer, the n-type diamond layer, the first intrinsic diamond sublayer, and the second intrinsic diamond sublayer comprises single crystal material; and
the boron-containing layer comprises one or more of boron nitride, boron carbide, boron oxide, boron, or another boron compound.

8. The diode-based detector device of claim 1, comprising feature (ii).

9. The diode-based detector device of claim 3, wherein the intrinsic diamond layer comprises a thickness in a range of from 10 nanometers to 5 microns.

10. The diode-based detector device of claim 8, wherein the intrinsic diamond layer comprises a thickness in a range of from 6 microns to 300 microns.

11. The diode-based detector device of claim 1, comprising features (i) and (ii).

12. The diode-based detector device of claim 1, further comprising a first metal-containing contact adjacent to the n-type diamond layer, and a second metal-containing contact adjacent to the p-type diamond layer.

13. The diode-based detector device of claim 12, wherein the first metal-containing contact comprises an ohmic contact or a Schottky contact, and the second metal-containing contact comprises an ohmic contact.

14. The diode-based detector device of claim 1, wherein boron atoms present in the boron-containing layer comprise at least 21% $^{10}$B.

15. The diode-based detector device of claim 1, wherein each of the p-type diamond layer, the n-type diamond layer, and the intrinsic diamond layer comprises single crystal or polycrystalline material.

16. The diode-based detector device of claim 1, wherein the p-type diamond layer is doped with boron, and the n-type diamond layer is doped with phosphorus or nitrogen.

17. The diode-based detector device of claim 1, being configured to operate at an applied voltage of greater than or equal to 0 V.

18. The diode-based detector device of claim 1, being configured for detection of one or more of neutrons, protons, alpha particles, or beta particles, or being configured for detection of one or more of X-rays, ultraviolet rays, gamma rays, or photons.

19. A diode-based detector device comprising:
a p-type diamond layer comprising single crystal diamond material doped with boron at a first concentration;
a n-type diamond layer;
an intrinsic diamond layer arranged between the p-type diamond layer and the n-type diamond layer, wherein the intrinsic diamond layer includes a first intrinsic diamond sublayer and a second intrinsic diamond sublayer; and
a boron-containing layer arranged proximate to at least one of the n-type diamond layer or the intrinsic diamond layer, wherein the boron-containing layer comprises one or more of boron nitride, boron carbide, boron oxide, boron, another boron compound, or a conducting metal boride;
wherein the boron-containing layer is arranged between the first intrinsic diamond sublayer and the second intrinsic diamond sublayer; and
wherein the boron-containing layer comprises a p-type single crystal diamond material doped with boron at a second concentration, wherein the second concentration is less than the first concentration.

20. A diode-based detector device comprising:
a p-type diamond layer;
a n-type diamond layer; and
an intrinsic diamond layer arranged between the p-type diamond layer and the n-type diamond layer; and
a boron-containing layer is arranged proximate to at least one of the n-type diamond layer or the intrinsic diamond layer, wherein the boron-containing layer comprises one or more of boron nitride, boron carbide, boron oxide, boron, another boron compound, or a conducting metal boride; and
a first metal-containing contact adjacent to the n-type diamond layer, and a second metal-containing contact adjacent to the p-type diamond layer, wherein the first metal-containing contact is arranged between the n-type diamond layer and the boron-containing layer.

21. A diode-based detector device comprising:
a p-type diamond layer;
a n-type diamond layer; and
an intrinsic diamond layer arranged between the p-type diamond layer and the n-type diamond layer; and
a boron-containing layer is arranged proximate to at least one of the n-type diamond layer or the intrinsic diamond layer, wherein the boron-containing layer comprises one or more of boron nitride, boron carbide, boron oxide, boron, another boron compound, or a conducting metal boride; and
wherein the boron-containing layer comprises a conducting boron-containing layer, and the n-type diamond layer is arranged between the conducting boron-containing layer and the intrinsic diamond layer.

22. The diode-based detector device of claim 21, wherein the conducting boron-containing layer serves as a first contact, and the diode-based detector device further comprises a metal-containing contact adjacent to the p-type diamond layer.

* * * * *

UNITED STATES PATENT AND TRADEMARK OFFICE
CERTIFICATE OF CORRECTION

PATENT NO. : 11,063,162 B2
APPLICATION NO. : 16/601038
DATED : July 13, 2021
INVENTOR(S) : Jason M. Holmes et al.

It is certified that error appears in the above-identified patent and that said Letters Patent is hereby corrected as shown below:

In the Claims

Claim 9, Column 30, Line 22, replace "The diode-based detector device of claim 3" with --The diode-based detector device of claim 8--.

Signed and Sealed this
Twenty-first Day of September, 2021

Drew Hirshfeld
*Performing the Functions and Duties of the
Under Secretary of Commerce for Intellectual Property and
Director of the United States Patent and Trademark Office*